US011488657B1

(12) United States Patent
Huang et al.

(10) Patent No.: US 11,488,657 B1
(45) Date of Patent: Nov. 1, 2022

(54) FAST INTERVAL READ SETUP FOR 3D MEMORY

(71) Applicant: MACRONIX INTERNATIONAL CO., LTD., Hsinchu (TW)

(72) Inventors: Jen-Hung Huang, Miaoli (TW); Han-Sung Chen, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/234,236

(22) Filed: Apr. 19, 2021

(51) Int. Cl.
*G11C 7/12* (2006.01)
*G11C 11/4091* (2006.01)
*G11C 11/4094* (2006.01)
*G11C 16/26* (2006.01)
*G11C 16/10* (2006.01)
*G11C 16/24* (2006.01)
*G11C 16/04* (2006.01)

(52) U.S. Cl.
CPC ...... *G11C 11/4091* (2013.01); *G11C 11/4094* (2013.01); *G11C 16/0483* (2013.01); *G11C 16/107* (2013.01); *G11C 16/24* (2013.01); *G11C 16/26* (2013.01)

(58) Field of Classification Search
CPC ... G11C 16/26; G11C 16/0483; G11C 16/107; G11C 16/24; G11C 16/30
See application file for complete search history.

(56) References Cited

U.S. PATENT DOCUMENTS

| 9,230,665 B2 | 1/2016 | Hosono |
| 10,211,218 B2 | 2/2019 | Lue |
| 10,360,101 B2 | 7/2019 | Kodama et al. |
| 10,521,287 B2 | 12/2019 | Khoueir et al. |
| 11,270,776 B1* | 3/2022 | Lien ........................ G11C 16/30 |
| 2002/0039311 A1 | 4/2002 | Takeuchi et al. |

(Continued)

FOREIGN PATENT DOCUMENTS

TW 202038232 A 10/2020

OTHER PUBLICATIONS

Spinelli, et al., "Reliability of NAND Flash Memories: Planar Cells and Emerging Issues in 3D Devices," Computers. 2017; 6(2), Apr. 21, 2017, 55 pages.

(Continued)

*Primary Examiner* — Mushfique Siddique
(74) *Attorney, Agent, or Firm* — Andrew L. Dunlap; Haynes Beffel & Wolfeld LLP

(57) ABSTRACT

A memory having a plurality of blocks is coupled with control circuits having logic to execute a no-current read setup operation, the read setup operation comprising simultaneously applying a read setup bias to a plurality of memory cells of a selected block of the plurality of blocks while disabling current flow. Logic to traverse the blocks in the plurality of blocks can apply the read setup operation to the plurality of blocks. The blocks in the plurality of blocks can include, respectively, a plurality of sub-blocks. The read setup operation can traverse sub-blocks in a block to simultaneously apply the read setup bias to more than one individual sub-block of the selected block. A block status table can be used to identify stale blocks for the read setup operation. Also, the blocks can be traversed as a background operation independent of read commands addressing the blocks.

18 Claims, 14 Drawing Sheets

(56) References Cited

U.S. PATENT DOCUMENTS

| | | | |
|---|---|---|---|
| 2005/0146959 A1 | 7/2005 | Shiga | |
| 2007/0140016 A1* | 6/2007 | Kamei | G11C 16/3468 |
| | | | 365/185.23 |
| 2014/0016413 A1 | 1/2014 | Han et al. | |
| 2016/0179402 A1 | 6/2016 | Iwashiro et al. | |
| 2016/0205054 A1 | 7/2016 | Lu et al. | |
| 2017/0185299 A1 | 6/2017 | Conley et al. | |
| 2020/0012598 A1* | 1/2020 | Feng | G06F 3/065 |
| 2020/0226080 A1* | 7/2020 | Tarango | G06F 13/102 |
| 2021/0366561 A1* | 11/2021 | Senoo | G11C 16/26 |
| 2022/0028460 A1 | 1/2022 | Kurose et al. | |
| 2022/0068390 A1* | 3/2022 | Wang | G11C 16/26 |

OTHER PUBLICATIONS

Zambelli, et al., "First Evidence of Temporary Read Errors in TLC 3D-NAND Flash Memories exiting from an Idle State," IEEE J. of the Electron Devices Society, vol. 8, Jan. 10, 2020, 6 pages.

U.S. Office Action in U.S. Appl. No. 17/153,525 dated Mar. 31, 2022, 12 pages.

* cited by examiner

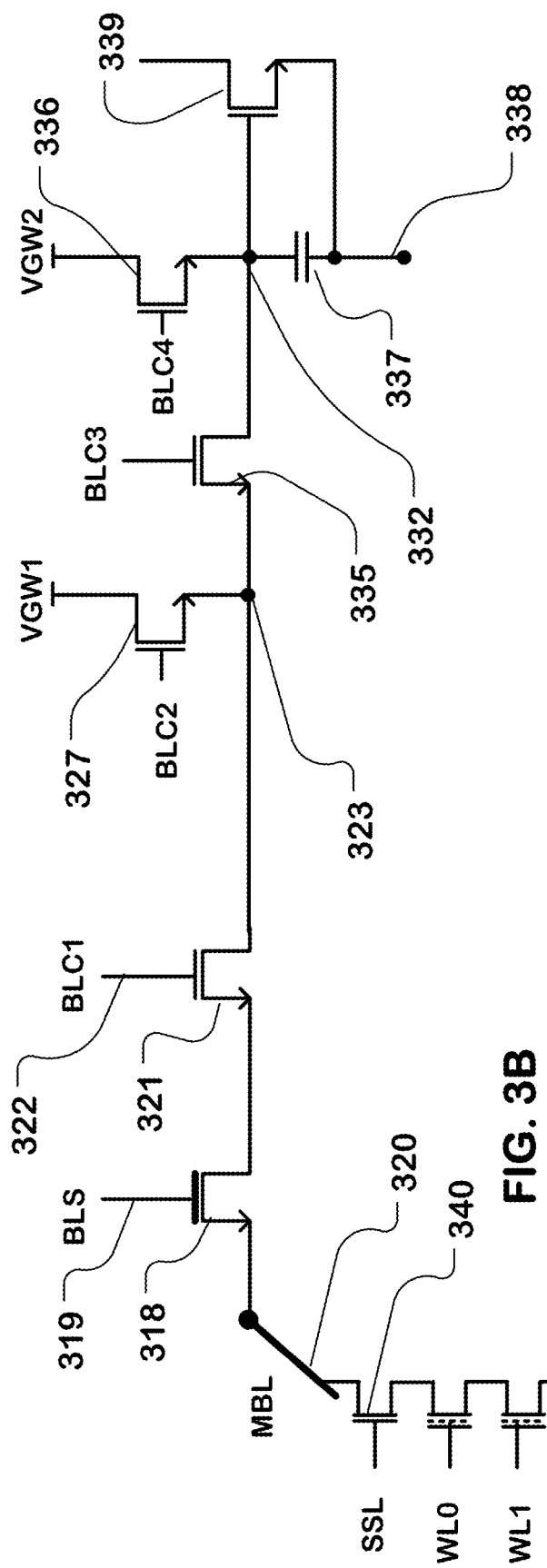
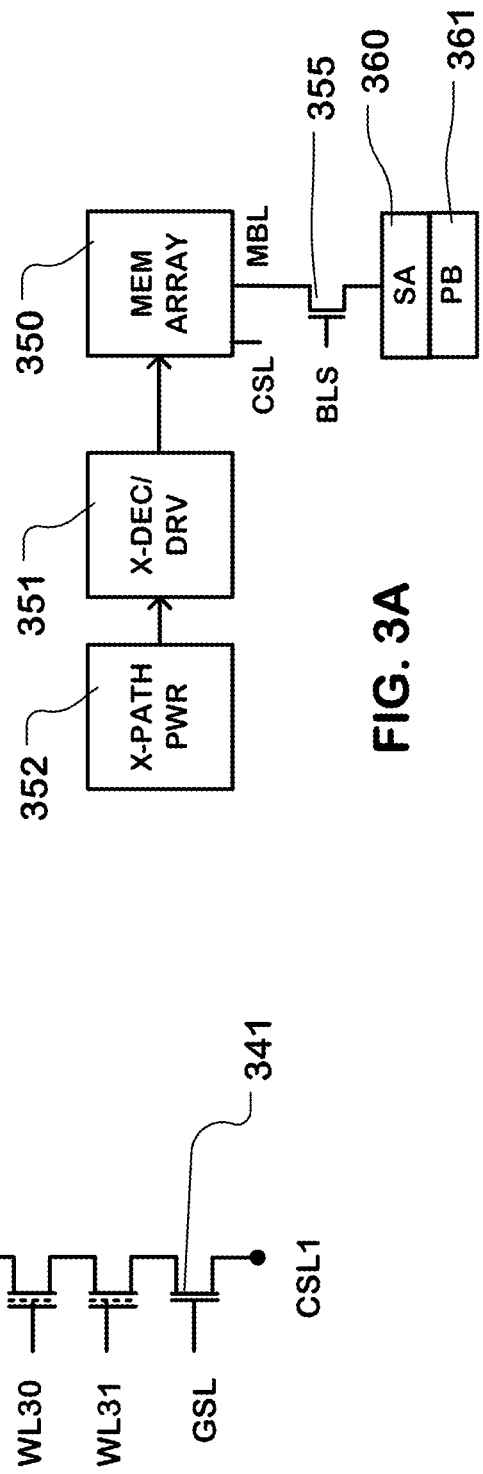
FIG. 3B
FIG. 3A

FAST INTERVAL READ SETUP FOR 3D MEMORY

BACKGROUND

Field

The present invention relates to integrated circuit memory, including nonvolatile flash memory, and methods for operating the same.

Description of Related Art

In high density memory, such as 3D memory, the channel of memory cell transistors can have different resistivities before and after stress. For example, thin film polysilicon used in the vertical channel structures of 3D NAND memory can suffer changes in resistivity over time. The different resistances that arise because of this characteristic can cause the threshold voltages to shift by, for example, 10 to 30 milliVolts, which in turn can reduce the operating windows for the memory.

It is desirable to provide technologies than can improve the operating window for memory in these conditions.

SUMMARY

A memory is described comprising a memory array having a plurality of blocks, wherein blocks in the plurality of blocks are arranged to be activated for memory operations in response to corresponding groups of word lines. Control circuits are part of or coupled to the memory, and comprise logic to execute a read setup operation, including no-current read setup operations.

Generally, a device is described comprising a plurality of memory cells, and a plurality of bit lines, and sense amplifier circuits. Control circuits for the memory array comprise logic to execute a read setup operation, which can maintain more consistent resistivities or operating threshold voltages during the operation of the memory array. The read setup operation comprises applying a read setup bias to selected memory cells in the memory array, and disabling current flow through the selected memory cells to the sense amplifier circuits during the read setup bias.

Examples are described in which the memory cells are disposed in a plurality of NAND strings, each NAND string in the plurality of NAND strings having a string select gate controllable to connect the NAND string to, or disconnect the NAND string from, a corresponding bit line in the plurality of bit lines. An example read setup operation disables said current flow by controlling the string select gate to disconnect the NAND string from the corresponding bit line.

Examples are described in which the memory array includes a plurality of NAND strings, each NAND string in the plurality of NAND strings having a source side select gate controllable to connect the NAND string to, or disconnect the NAND string from, a source side reference line. An example read setup operation disables said current flow by controlling the source side select gate to disconnect the NAND string from the source side reference line.

In other examples, the memory cells are disposed in a NOR architectures, having local bit lines with block select gates controllable to connect a column of memory cells in the block to, or disconnect the column of memory cells from, a corresponding bit line in the plurality of bit lines.

Examples are described in which the memory array includes bit line select gates controllable to connect and disconnect the sense amplifier circuits from bit lines in the memory array. An example read setup operation disables said current flow by controlling the bit line select gates to disconnect the bit lines coupled to the selected memory cells from the sense amplifier circuits.

The read setup operation needs to be executed periodically. In this way, it can achieve the purpose of maintaining a more consistent distribution of electrons near the inversion layer in the memory cell channels when the memory cells are activated for read operations separated in time. A read setup operation described herein includes applying a read setup bias that includes a gate-to-channel voltage, while blocking, or turning off, cell current between the memory cells and a sense amplifier circuit. The cell current can be blocked by disconnecting the memory cells from the sensing amplifier unit, using for example a MOSFET switch in the current path. Therefore, the power loss caused by the cell current can be greatly reduced.

In the case of memory arrays comprising NAND strings, there can be a plurality of switches usable to disconnect the memory cell current from the sense amplifier circuits. NAND strings can include upper select switches (also called string select gates SSGs), which are used to connect and disconnect the corresponding NAND strings from global bit lines. Also, NAND strings can include lower select switches (also called ground select gates GSGs), which are used to connect and disconnect the corresponding NAND strings from source bias lines such as common source lines or ground. The biasing arrangement for the read setup operation can disconnect the current flow from the memory cells to the sense amplifier circuit by turning off the upper select switches, turning off the lower select switches, or turning off both the upper and lower select switches.

Also, in some embodiments, a bit line select switch is disposed between a global bit line and the sense amplifier circuit. The biasing arrangement for the read setup operation can disconnect the current flow from the memory cells to the sense amplifier circuit by turning off the bit line select switch.

The read setup operation can comprise simultaneously applying a no-current read setup bias to a plurality of memory cells disconnected from the sense amplifier circuit, of a selected block of the plurality of blocks. Logic to traverse the blocks in the plurality of blocks is described, to apply the read setup operation to the plurality of blocks. The blocks in the plurality of blocks can include, respectively, a plurality of sub-blocks, wherein sub-blocks in the plurality of sub-blocks are arranged to be activated for connection to the set of global bit lines for memory operations in response to corresponding sub-block string select lines, and a sub-block comprises a plurality of NAND strings. The read setup operation can include traversing the sub-blocks in the selected block, to simultaneously apply the read setup bias to respective pluralities of memory cells of individual sub-blocks of the selected block, including embodiments in which more than one NAND string connected to a single global bit line receives the setup bias simultaneously. For the purposes of this description, "simultaneously" means that the biasing arrangements overlap in time, at least partially, so that all simultaneous biasing arrangements consume current to increase combined current consumption for the memory array.

Embodiments can include maintaining a block status table identifying stale blocks, and the read setup operation can be applied to stale blocks identified in the block status table.

Alternatively, the blocks in the array can be traversed sequentially, or in a systematic order, as a background operation or otherwise independent of read commands addressing the blocks, to maintain readiness of the memory cells for subsequent read operations.

A method of operating a memory is described, including blocking current flow between memory cells and sense amplifier circuits during read setup operations.

The method can be deployed in a memory in which each block in the plurality of blocks of memory cells has a plurality of sub-blocks, each sub-block including a distinct subset of the set of NAND strings of the block, the distinct subset of NAND strings in each sub-block being operatively connected to a respective sub-block string select line by which gate voltages are applied to the string select gates of the NAND strings in the distinct subset of the sub-block. The read setup bias operations can be applied to more than one sub-block in a single block simultaneously.

Other aspects and advantages of the present invention can be seen on review of the drawings, the detailed description and the claims, which follow.

BRIEF DESCRIPTION OF THE DRAWINGS

FIG. 3A is a simplified schematic diagram of a sense amplifier and bit line bias circuit usable in a device as described herein.

FIG. 3B is a simplified block diagram illustrating aspects of a memory device involved in a read setup bias in some embodiments.

DETAILED DESCRIPTION

A detailed description of embodiments of the present invention is provided with reference to the FIGS. 1-14.

Figure 1:
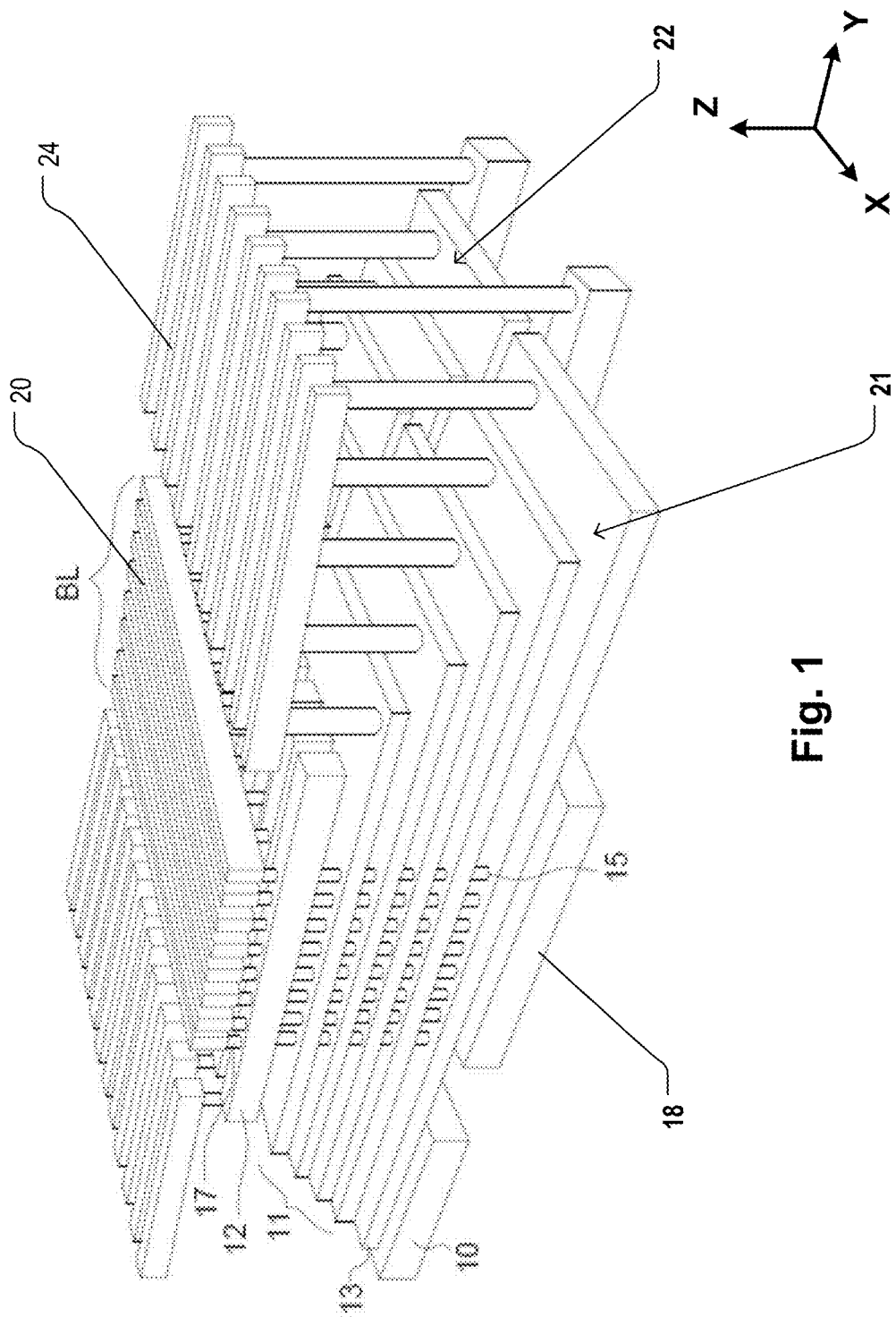
FIG. 1 is a perspective view of a 3D vertical NAND structure, having a block and sub-block architecture.

FIG. 1 is a perspective view of a 3D semiconductor device including a plurality of blocks and sub-blocks of memory cells in a plurality of vertical NAND strings. It comprises a multilevel stack of word line layers 11 configured as a first stack 21 of word line layers and a second stack 22 of word line layers, each parallel to the substrate 10, and a plurality of pillars (e.g. 15, 17) oriented orthogonally to the substrate in the Z direction as labeled in this figure extending through corresponding stacks of word line layers. The pillars comprise respective semiconductor bodies providing channels, which can be thin film channels less than 10 nm thick, of a plurality of series-connected memory cells located at crosspoints between the pillars and the word lines in a NAND string configuration. A plurality of string select lines (SSLs) 12 is oriented parallel to the substrate in the Y direction, as labeled in this figure, and above the word line layers 11. In this example, first and second blocks of memory cells are formed in the first stack 21 and in the second stack 22, respectively, each coupled to different sets of NAND strings. Each of the string select lines intersects a respective distinct subset (e.g. one or more rows) of the set of pillars in a corresponding block, where each sub-block of memory cells in the corresponding block is formed in a subset of pillars coupled to a respective string select line.

The structure also includes a plurality of parallel global bit line conductors 20 in a layer parallel to the substrate extending in the X direction as labeled in this figure, and above the string select lines. Each of the global bit line conductors superposes a respective column of the pillars in the array across multiple blocks, each column including one pillar in each subset of pillars for each string select line. Also, the word line layers 11 are connected to overlying conductors (e.g. 24) in this example, for electrical connection to word line decoders and drivers.

Each intersection of a pillar and a string select line defines an upper select switch of the pillar for connection to a corresponding bit line. Each of the pillars underlies and is coupled by the upper select switch of the pillar to one of the bit line conductors.

Lower select lines 13 intersect with the pillars to form lower select switches under the word line layers 11 to couple the pillars to one or more source lines such as a common source conductor 18. The common source conductor can be connected to bias circuitry by vertical connections between the blocks, or otherwise.

The structure of FIG. 1 is one example of a memory including a plurality of blocks of memory cells and a plurality of bit lines, each block including a group of word lines (i.e. a stack in FIG. 1), and a set of NAND strings having string select gates for connection to corresponding bit lines in the plurality of bit lines, and in which each NAND string in the set of NAND strings of the block is connected to the group of word lines. Also, it is an example of a memory in which each block in the plurality of blocks of memory cells has a plurality of sub-blocks, each sub-block including a distinct subset of the set of NAND strings of the block. Also, in this example, the distinct subset of NAND strings in each sub-block is operatively connected to a respective sub-block string select line by which gate voltages are applied to the string select gates of the NAND strings in the distinct subset of the sub-block.

In structures like that illustrated in FIG. 1, an operation can be applied to limit the impact of the changing resistivities of channel semiconductor materials over time. For example, in some memory architectures when programming the memory cells, the channel polysilicon is stressed so that the thresholds set by the program are based on the stressed condition resistivities. To address this issue, a read setup bias can be applied to stress memory cells to be read. After the read setup, the channel can maintain the stressed condition for an interval of time, such as 10 minutes or so. So, the cell may be read within that interval without requiring another stress read bias.

Figure 2:
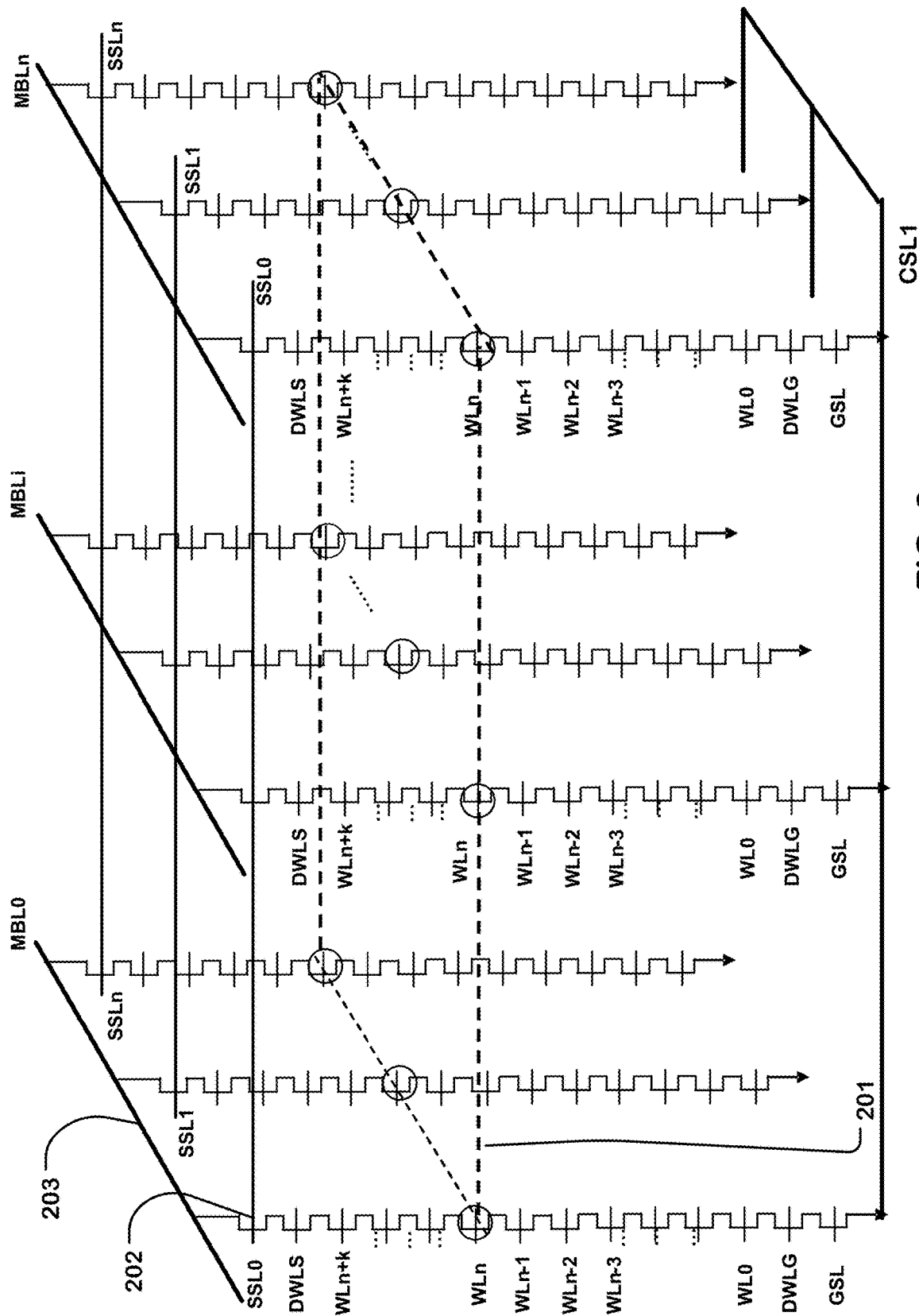
FIG. 2 is a circuit schematic diagram of a block of NAND flash memory cells, which can be implemented using an architecture like that of FIG. 1.

FIG. 2 is a schematic diagram of a block of memory cells in a 3D NAND device which can comprise many blocks, and in which a block includes a plurality of sub-blocks. In the schematic, a plurality of global bit lines MBL0 to MBLn overlies an array of NAND strings arranged in rows and columns. Each of the NAND strings comprises a series-connected string of memory cells, such as dielectric charge trapping memory cells, between a corresponding bit line and a reference line such as the common source line CSL. In some embodiments, the common source line for a block can be implemented as one or more reference lines, and may be coupled to biasing circuitry by which operating voltages are applied in various operations of the memory.

In a 3D NAND arrangement, the set of NAND strings of the block shown in FIG. 2 corresponds with pillars of FIG. 1, for example. The NAND strings of the plurality of NAND strings are coupled with a corresponding stack of word lines WL0 to WLn+k, in which each word line is coupled to memory cells at its layer, in all the NAND strings in the block, in this example. At word line WLn, the planar structure of each of the word line layers is represented by the dashed line 201. Thus, all the memory cells in the block at the level of a given word line, such as WLn, in the block are coupled to that given word line, such as WLn, so that they can be activated by voltages applied to the given word line.

Also, each of the NAND strings includes a corresponding sub-block string select gate (e.g. 202) configured to connect the NAND string to a particular bit line (e.g. 203) in the plurality of bit lines.

A plurality of sub-block string select lines SSL0 to SSLn are operatively coupled to the string select gates of respective distinct subsets of NAND strings, where each subset of NAND strings includes a sub-block of the block of memory cells, to apply gate voltages to the sub-block string select gates. Current flow through memory cells in the NAND strings in the distinct subsets is blocked, when the string select gates are off.

Also, each of the NAND strings includes a corresponding lower select gate configured to connect the NAND string to the common source line or one of the one or more reference lines used to implement the common source line. A lower select gate layer GSL is coupled to all the lower select gates for the NAND strings in the block in this example. In another example, there can be a plurality of lower select gate lines arranged for connection to the lower select gates in the block. Current flow through memory cells in the NAND strings is blocked, when the lower select gates are off on the NAND strings.

In this example, a lower dummy word line DWLG lies between the lower select gate layer GSL and the lowest word line layer WL0, and an upper dummy word layer DWLS lies between the string select lines SSL0 to SSLn and the uppermost word line layer WLn+k.

In the circuit of FIG. 2, in order to select a particular memory cell in the block, a sub-block is activated by a sub-block string select line which connects each NAND string in the selected sub-block to a respective bit line in the plurality of bit lines, and a word line layer is selected which selects one memory cell at the level of the selected word line on each NAND string in the selected sub-block. The selected memory cell is activated by selecting one bit line corresponding to the NAND string in which the selected memory cell is located. This arrangement enables activation of a plurality of memory cells in parallel, one in each of the NAND strings of the selected sub-block, via its corresponding bit line and word line layer.

"Activate", as used herein, means to apply a particular bias so as to give effect to the connected cells or switches. The bias may be high or low, depending on the operation and the memory design. For the purposes of this description, the term "charging" refers to both driving the node to a higher voltage and driving the node to a lower voltage, including ground and negative voltages in some embodiments.

A NAND block as described herein can be implemented using a 3D NAND memory technology. Implementations can also be made using 2D NAND technology. Also, implementations can be made using 3D or 2D NOR technology, or other array architectures.

FIG. 3A is a simplified illustration of memory depicting the sense amplifier circuit in an arrangement used for NAND memory in some cases. The memory includes a memory array 350. Current flow through memory cells in the memory array 350 flows from the common source line CSL, through the memory cell to the global bit line MBL. The current on the MBL flows through a bit line select transistor 355, configured as a switch to a sense amplifier 360, the output of which is applied to a page buffer 361. The bit line select transistor 355 can be part of a column decode circuit. The bit line select transistor is turned on and off by a signal on the bit line select line BSL. Word lines and, in some examples, string select lines and ground select lines are selected in a given access to the memory, by an X-decoder and driver 351. Power and bias voltages are provided for the X-path circuits, including word lines and, in some examples, string select lines and ground select lines, by the X-path power circuits 352. Current flow through memory cells on a given global bit line in the memory is blocked, when the bit line select transistor for that global bit line is off.

FIG. 3B illustrates a more detailed schematic diagram of the structure of a sense amplifier and bit line bias circuit which can be used to apply bias voltages to each bit line in the plurality of bit lines. There can be one sense amplifier and bit line bias circuit for each global bit line coupled to a selected block of the array.

The circuit in FIG. 3B is connected to a global bit line 320. A bit line select transistor 318 has a first source/drain terminal connected to the global bit line 320 and a second source/drain terminal. A gate of the bit line select transistor 318 is connected to a bit line select signal BLS on line 319. Each NAND string includes, as discussed above, an upper select gate controlled by an upper string select line SSL, and a lower select gate controlled by a lower string select line GSL.

A bit line clamp transistor 321 has a first source/drain terminal connected to the second source/drain terminal of transistor 318, and a second source/drain terminal connected to connecting node 323. The bit line clamp transistor 321 has its gate connected to the BLC1 line 322 at which bias voltages are applied by circuits, not shown, to control the voltage level of the MBL during precharge operations and other operations. A transistor 327 is provided for connecting node 323 to BLC2 line at which bias voltages are applied by circuits, not shown. A pass transistor 335 is connected between connecting node 323 and a sensing node 332.

The pass transistor 335 is controlled by a control signal BLC3, which controls connection and disconnection of the connecting node 323 to the sensing node 332. A transistor 336 is connected between the sensing node 332 and a bias voltage VGW2, and is controlled by signal BLC4. A capacitor 337 (capacitance) is coupled from sensing node 332 to a sense signal node 338. A sensing transistor 339 has a gate connected to the sensing node 332, a first current carrying terminal connected to the sense signal node 338 and a second current carrying terminal providing a sense amplifier output, which can be connected to latches of a page buffer.

During read operations and other operations, the transistors 318, 327 and 321 can be operated to set a bias voltage level on the selected bit lines as suits a particular operation.

Current flow through the memory cells on the NAND string is blocked when any of the transistors between the common source line CSL and the sense amplifier are turned off.

In another embodiment, the memory cells are arranged in a NOR architecture, having local bit lines connected to global bit line by block select gates, and in which memory cells on a given local bit line are connected in parallel between the local bit line and a source side terminal, such as a common source line. The sense amplifiers can have different implementations as well, including for example, memory cells that comprise comparators to compare a global bit line current or voltage from a selected memory cells to a reference voltage. The current flow can be enabled or disabled in NOR architecture embodiments by turning off column select transistors between the global bit lines and the sense amplifiers, or any other transistor in the current flow path between the source side terminal and the sense amplifier is turned off during the read setup bias operation. The memory cells on a given local bit line form a distinct sub-block of a block.

The techniques described herein can also be applied to memory cells arranged in other configurations.

Figure 4:
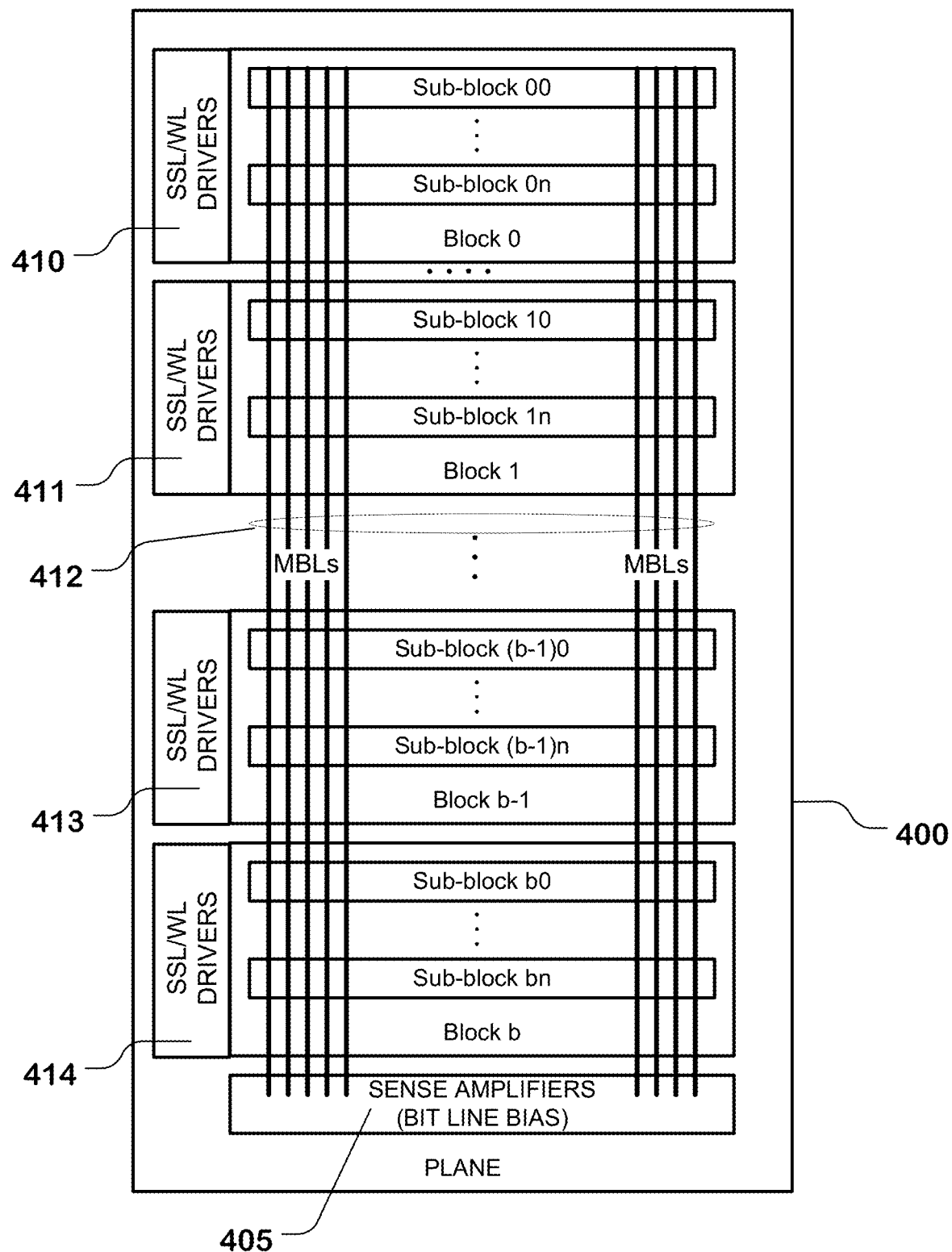
FIG. 4 is a block diagram of a segmentation of a memory plane according to embodiments described herein.
Figure 5:
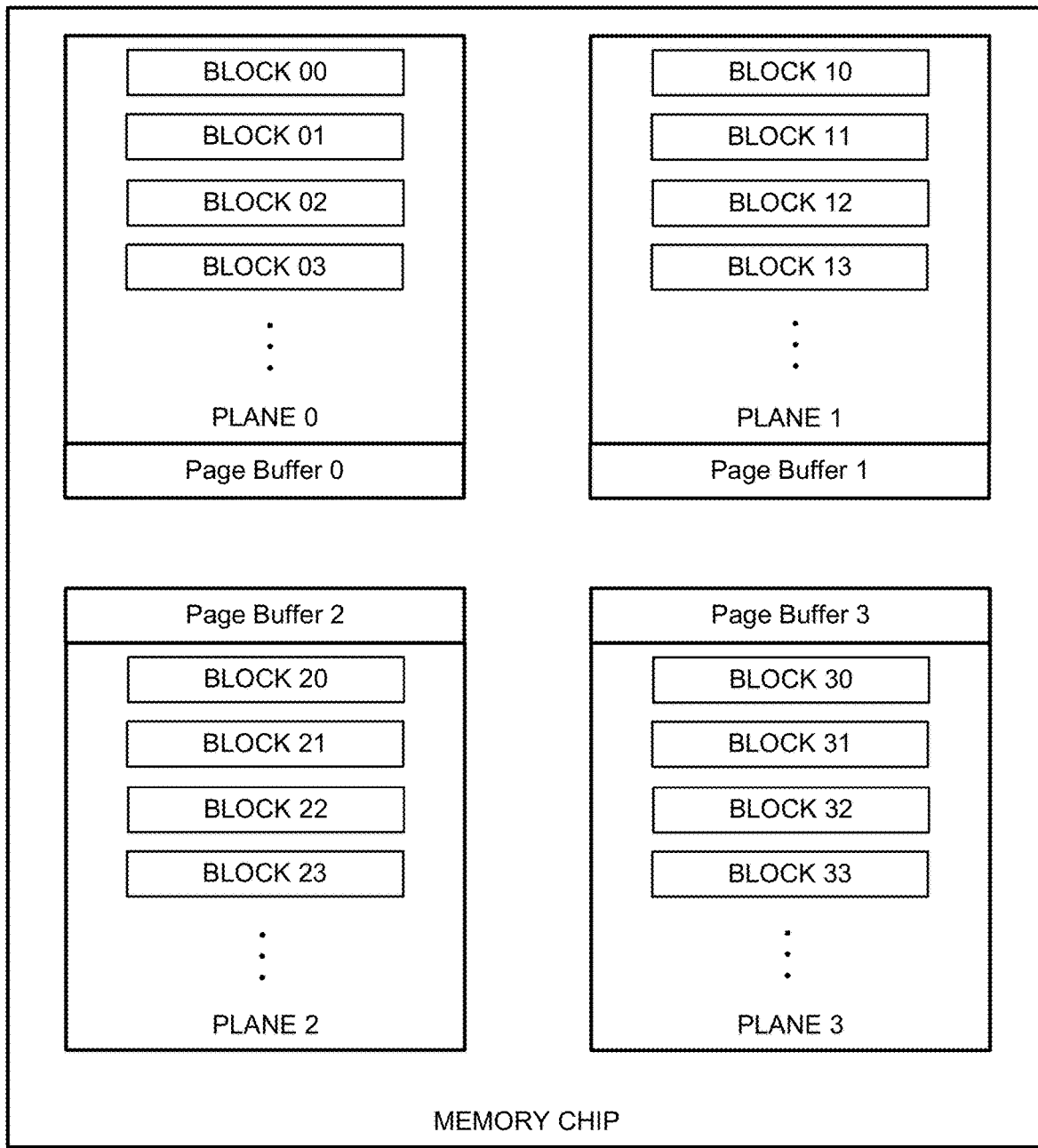
FIG. 5 is a block diagram of a segmentation of a memory array including multiple planes, according to embodiments described herein.

FIGS. 4 and 5 illustrate segmentation of a memory array on a memory device on a plane, block and sub-block levels, according to one example, to which the technology described herein can be applied. The technology described includes applying read setup operations that comprise applying bias voltages simultaneously to a plurality of memory cells to condition the plurality of memory cells for a subsequent read operation. The conditioning can condition the memory cell so that the resistivities and threshold voltages are more consistent during operation. In some embodiments, the conditioning can maintain resistivities and threshold voltages that match or are close to those established during a program operation, as mentioned above.

FIG. 4 illustrates a configuration of a single plane 400 in a memory array. The plane 400 includes a plurality of blocks, Block 0, Block 1, . . . Block (b−1) and Block(b). Each of the blocks includes a plurality of sub-blocks. Thus, block 0 includes sub-block 00 to sub-block 0n, block 1 includes sub-block 10 to sub-block 1n, Block (b−1) includes sub-block (b−1)0 two sub-block (b−1)n and Block b includes sub-block (b)0 two sub-block (b)n.

A plurality of global bit lines 412 (MBLs) superimposes, and is shared by, all of the blocks in the plane. A set of sense amplifiers and bit line bias circuits 405 (e.g. FIG. 3), which can be part of page buffer circuits, is coupled to the plurality of global bit lines 412, by which bias voltages can be applied to the global bit lines 412 in support of the read setup operations. The set of sense amplifiers and bit line bias circuits 405 is shared by all of the blocks in the plane. Each of the blocks includes corresponding string select line SSL and word line WL drivers 410, 411, 413, 414, by which bias voltages can be applied in support of the read setup operations. Also, a common source line driver can be applied to each of the blocks.

A read setup operation can be applied to only one block at a time in a given plane in some embodiments. In other embodiments, a read setup operation can be applied to multiple blocks simultaneously in a given plane. In other embodiments, the read setup operation for a block having a number "n" of sub-blocks, can be applied to more than one and fewer than "n" sub-blocks simultaneously. In other embodiments, the read setup operation can be applied to one or more sub-blocks in one block and one or more sub-blocks in another block of the plane simultaneously.

FIG. 5 illustrates a memory 500 including multiple planes, Plane 0, Plane 1, Plane 2 and Plane 3, in this example. Each of the planes includes distinct page buffer circuits, including Page Buffer 0, Page Buffer 1, Page Buffer 2, Page Buffer 3. The Page Buffers are coupled to input/output circuitry not shown, supporting high throughput memory operations on the multiple planes. As illustrated, each of the planes includes a plurality of blocks. Plane 0 includes Block 00, Block 01, Block 02, Block 03, . . . . Plane 1 includes Block 10, Block 11, Block 12, Block 13, . . . . Plane 2 includes Block 20, Block 21, Block 22, Block 23, . . . . Plane 3 includes Block 30, Block 31, Block 32, Block 33, . . . .

A read setup operation can be applied to one block or multiple blocks in a single plane as discussed with reference to FIG. 5. Also, a read setup operation can be applied to one block or multiple blocks in one plane, and one block or multiple blocks in another plane, simultaneously in some embodiments. Also, a read setup operation can be applied to one or more sub-blocks in one block of one plane, and one or more sub-blocks in one block of another plane simultaneously. Also, read setup operations can be applied to other read setup units, other than sub-block, block and plane units as suits a particular memory configuration.

Figure 6A:
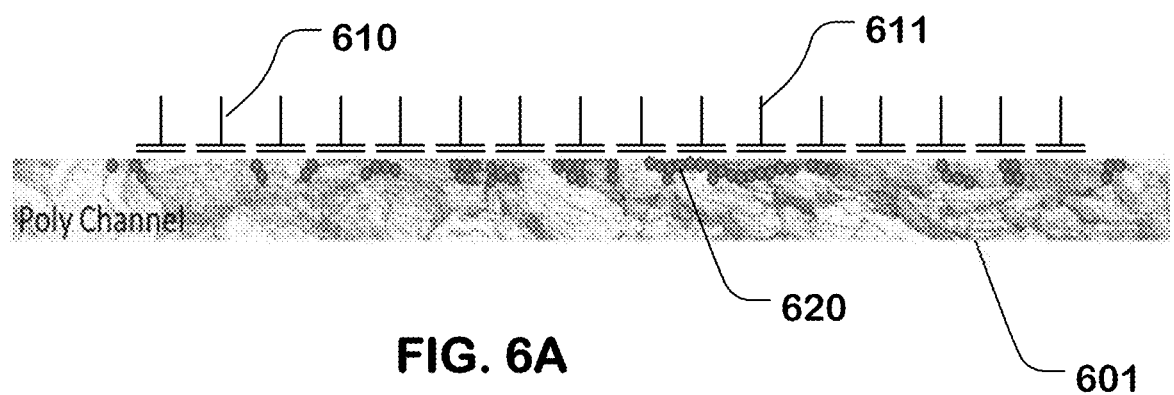
FIG. 6A is an illustration of a distribution of electrons in memory cell channels in a NAND string, in which a there is a concentration of electrons near the inversion regions.
Figure 6B:
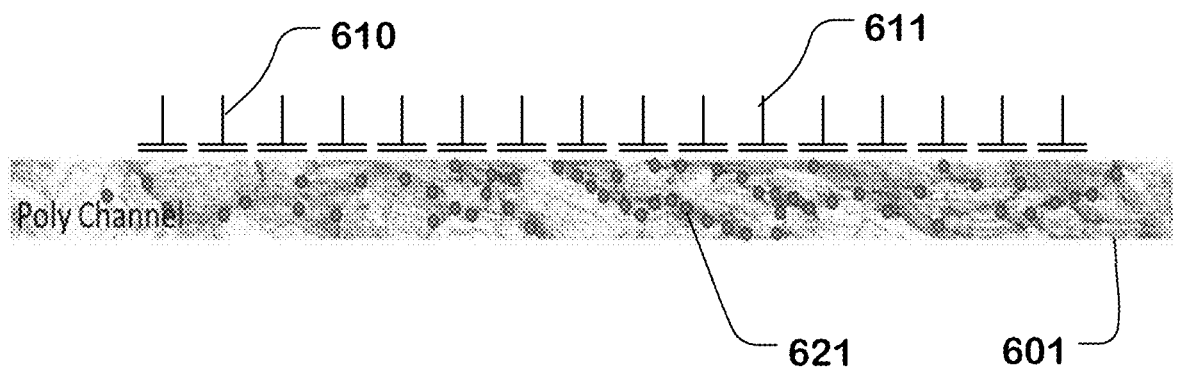
FIG. 6B is an illustration of a distribution of electrons in memory cell channels in a NAND string, in which electrons have migrated along grain boundaries away from the inversion regions.

FIGS. 6A and 6B illustrate electron distributions in a polysilicon channel 601 for a NAND string, having memory cell gates (e.g. 610, 611) along the channel. In FIG. 6A, the electrons (e.g. 620) are trapped near the inversion layer of the cells, closer to the surface of the channel beneath the memory cell gates, in the NAND string. After an idle state, the electrons (e.g. 621) may leave the inversion layer and become distributed along the grain boundaries of the polysilicon channel. This results in smaller concentration of electrons near the inversion layer, which can cause the channel resistance to increase reducing cell current during a read operation. This has the effect of increasing the thresholds of the memory cells. Applying a bias voltage on the word lines can help prevent this movement, or can reverse the movement of the electrons, so that read currents and thresholds are more consistent during operation of the memory.

Figure 7:
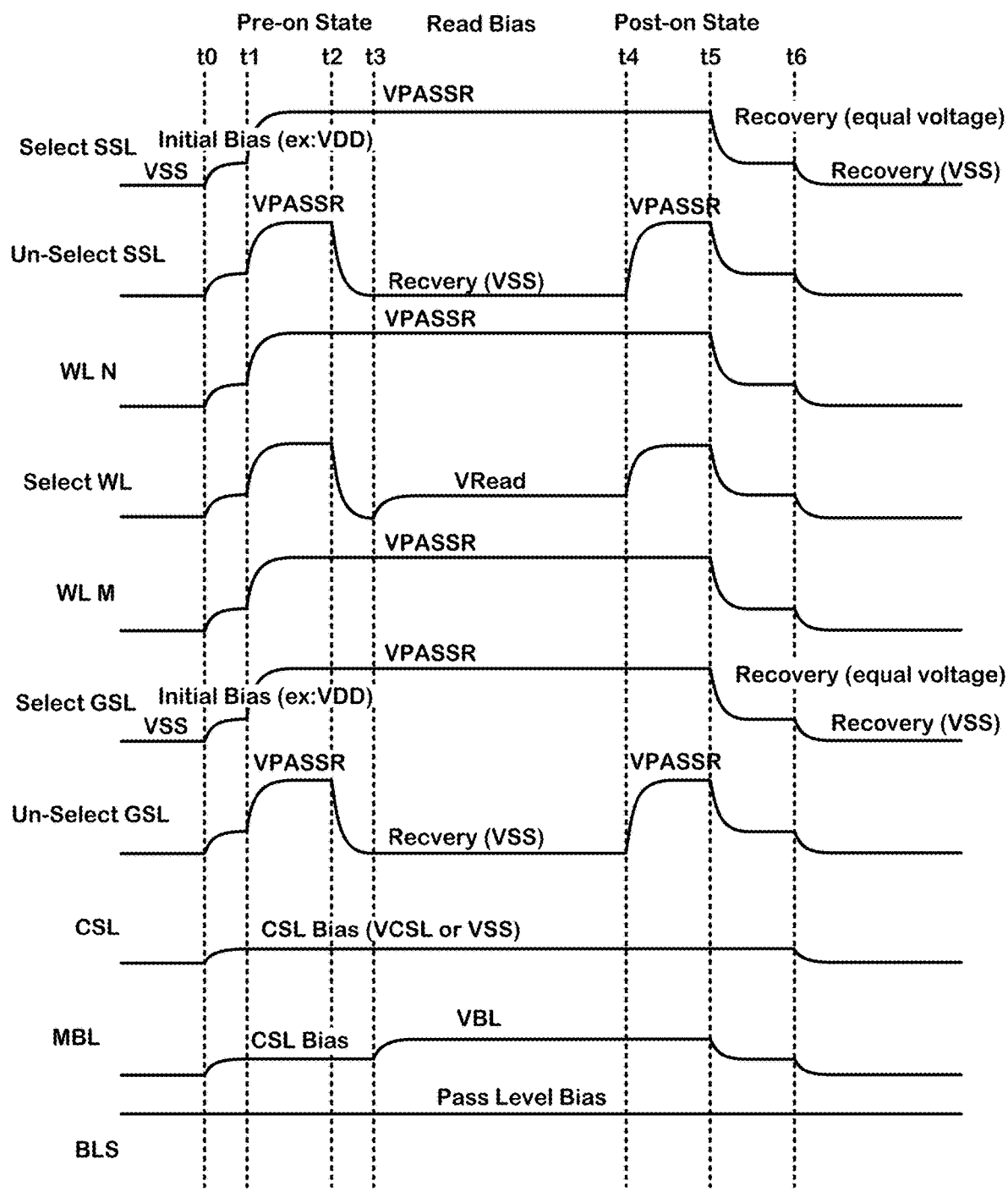
FIG. 7 is a timing diagram of a normal read bias arrangement for embodiments described herein.
Figure 8:
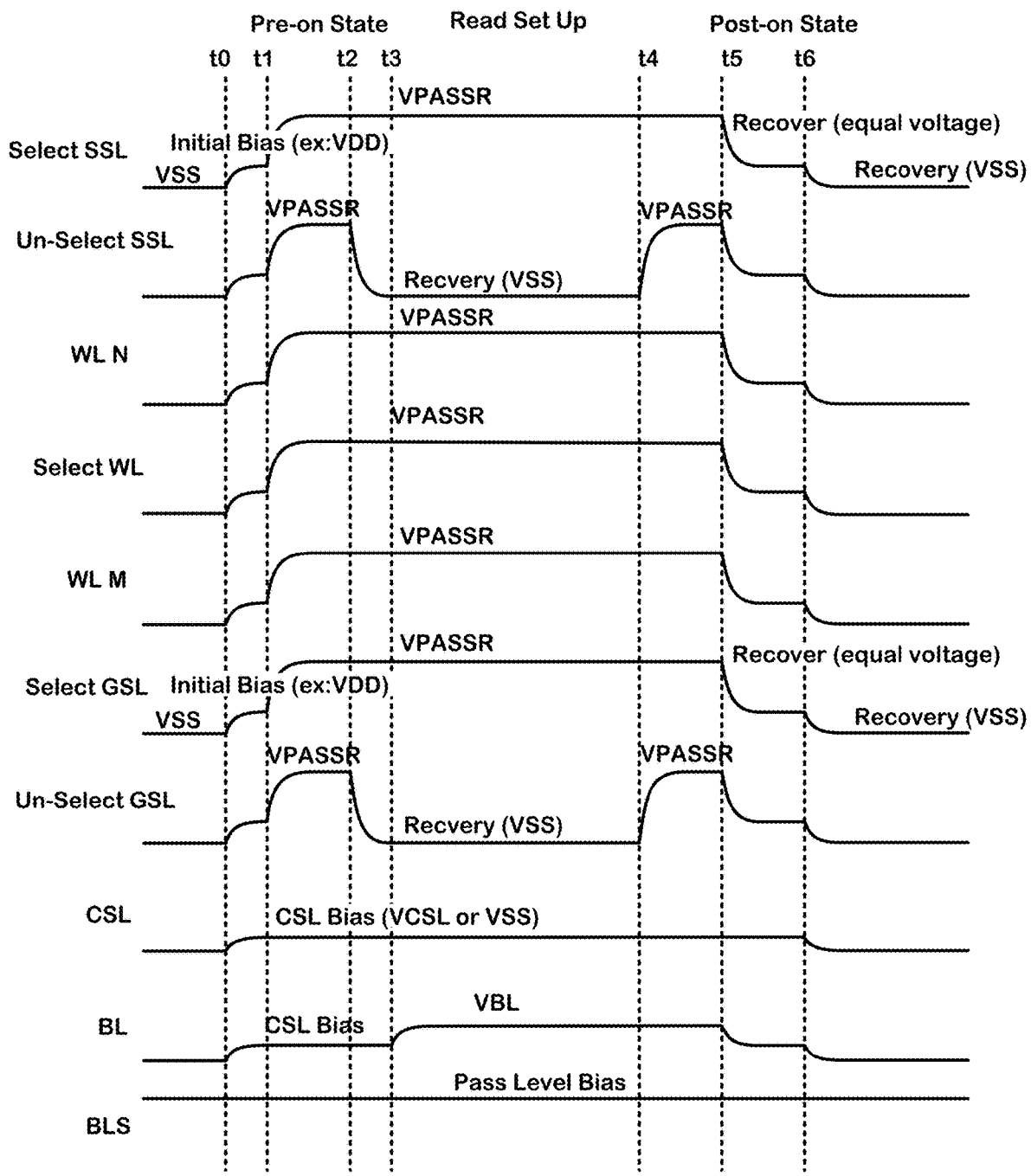
FIG. 8 is a timing diagram of a read setup bias arrangement, allowing current flow, for embodiments described herein.
Figure 9:
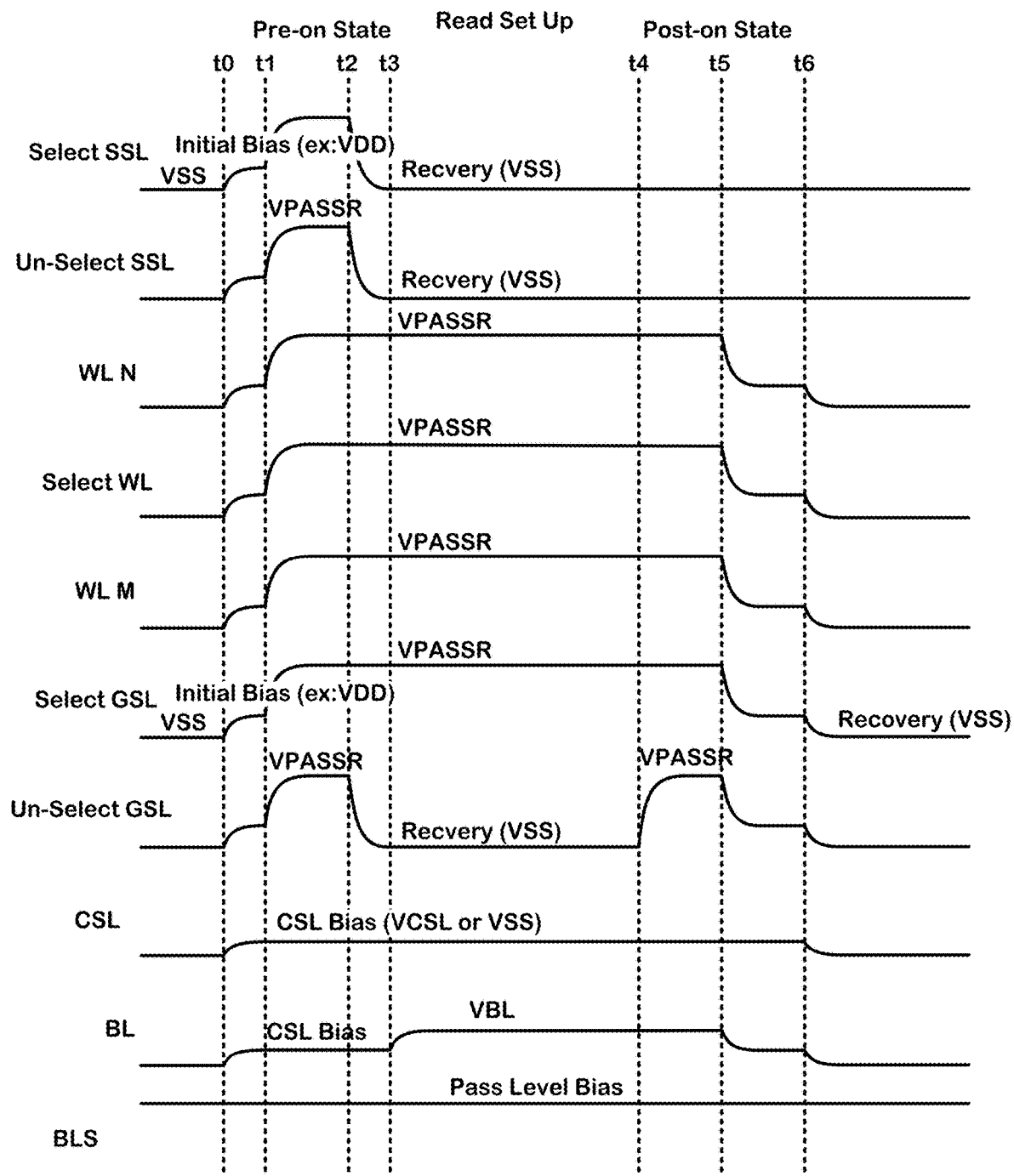
FIG. 9 is a timing diagram of a first embodiment of a read setup bias arrangement with current flow blocked.
Figure 10:
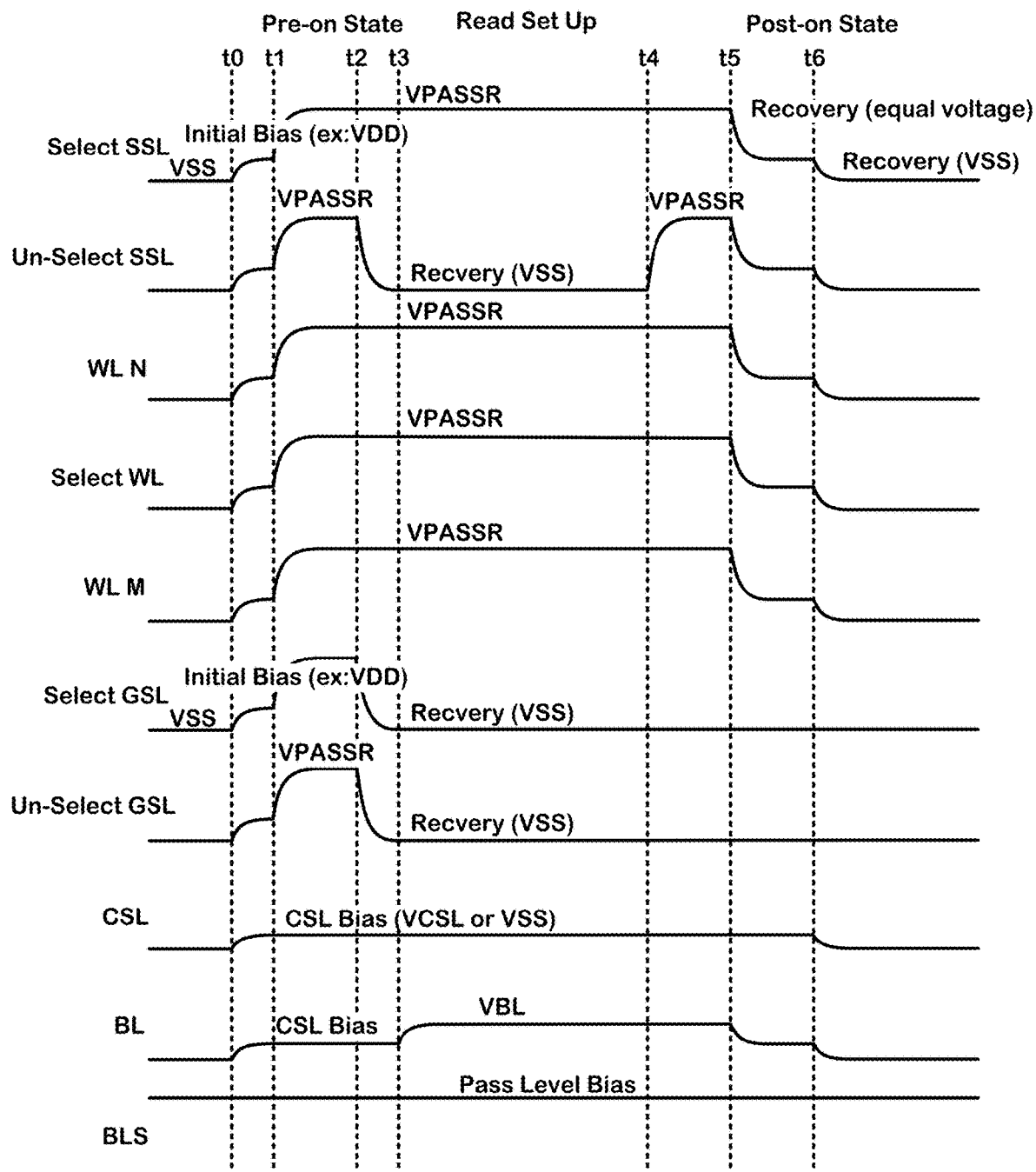
FIG. 10 is a timing diagram of a second embodiment of a read setup bias arrangement with current flow blocked.
Figure 11:
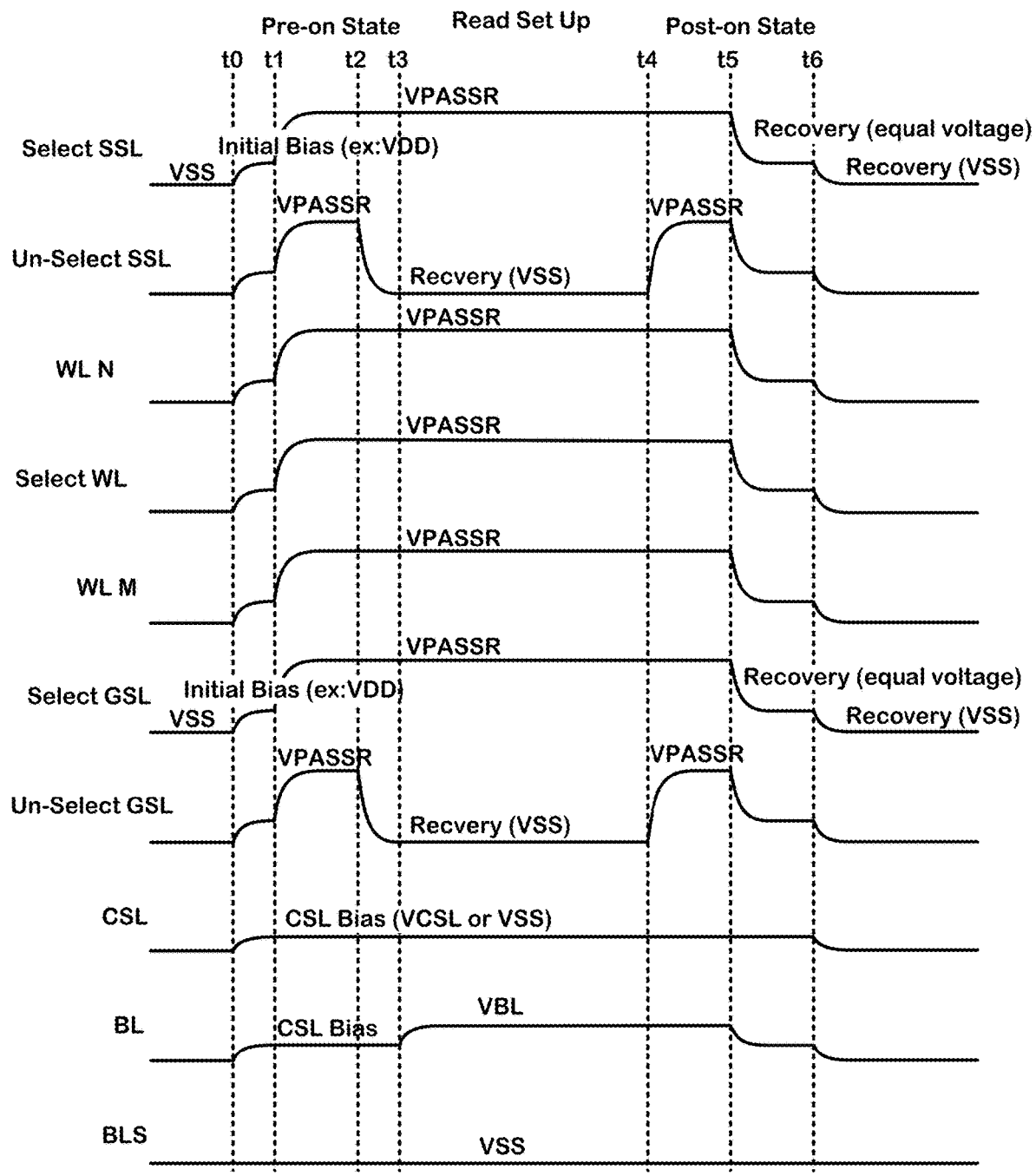
FIG. 11 is a timing diagram of a third embodiment of a read setup bias arrangement with current flow blocked.

FIG. 7, for reference, provides a read operation bias arrangement for a 3D NAND memory. FIG. 8 illustrates an embodiment of a read setup bias arrangement in which current flow is not blocked for a 3D NAND memory. FIG. 9 through FIG. 11 illustrate alternative embodiments of "no-current" read setup bias arrangements to be applied in read setup operations with current flow blocked to a 3D NAND memory. The bias arrangements of FIGS. 8 through 11 can be applied to a plurality of memory cells in parallel, simultaneously. The voltage levels indicated in the figures are representative. Other voltage levels may be used as desired for a given implementation The bias arrangements applied during a read setup operation can be determined based on the memory structure of the memory array, by trial and error or by simulation. In general, the bias arrangements applied during read setup operations should be set so as to prevent disturbing charge stored in the memory cells by amounts that could cause loss of data. In general, such bias arrangements will have voltages on the order of those applied during normal read operations.

FIG. 7 through FIG. 11 are examples which can be applied in a dielectric charge trapping, 3D NAND memory having vertical NAND gates, such as described herein with reference to FIGS. 1, 2 and 3A. Referring to the schematic diagrams of FIG. 2 and FIG. 3A, timing diagrams for voltages applied on the bit lines MBLs, the bit line select gate BLS, the selected and unselected string select lines SSLs, the selected word lines WLs, word lines above selected word lines WL N, word lines below selected word lines WL M, the selected and unselected lower select gate lines GSLs, and the common source line CSL of a selected block are illustrated.

While in some technologies, a read setup operation can be executed by performing a normal read operation of the memory cells within a specified period of time prior to the instant read operation, in technology described herein a setup read operation can be applied to traverse an entire memory array comprising one or more planes on a single chip in a systematic or periodic fashion. Thus, a read setup operation can have a lower drain side bias than a normal read. Also, a read setup operation can have a lower word line bias than a normal read. Also, a read setup bias operation can have a higher common source line bias than a normal read. Also, a read setup operation can have shorter word line and global bit line setup times to speed up the read setup operation.

In the techniques applied herein, multiple NAND strings coupled to a single bit line can receive read setup bias arrangements simultaneously. No-current bias arrangements are described which block current flow from the memory cells on the bit lines to the sense amplifier circuits during the read setup operation.

FIG. 7 is a timing diagram for an example of a read operation. The timing can be considered in three intervals. First interval between times t0 and t2 correspond with a precharge operation. Second interval between times t2 and t4 include the read bias arrangement. The third interval between times t4 and t6 correspond with a voltage recovery operation.

In this timing diagram, the bit line select signal BLS is set at a pass level bias, connecting the bit line to the sense amplifier circuitry throughout the operation. All the other signal lines are initially set to a voltage level such as VSS. Between t0 and t1, the selected SSL, unselected SSL, WL N, selected WL, WL M, selected GSL, and unselected GSL signal lines are raised to an initial state such as VDD, which can for example setup a charge pump voltage boost. The CSL line is set to a CSL bias voltage for the read, which can be VSS or a different voltage, VCSL. The bit line BL is set to the same voltage as the CSL. Between times t1 and t2, all the signal lines, with the exception of the common source line CSL and the bit line are boosted to a pass voltage level VPASSR.

During the interval t2 to t4, the read bias is applied. During time t2 to t3, the voltages are maintained, except on the unselected SSL, the selected WL and the unselected GSL, all of which are discharged to a recovery level, which can be about VSS. At time t3, all the voltages are maintained except the selected WL, which is increased to Vread, and the bit line, which is increased to VBL. During the read bias between times t3 and t4, current flows if the memory cell has a low threshold state from the CSL, through the memory cell on the bit line BL to the sense amplifier circuit.

During the interval between t4 and t6, the voltages are recovered. At time t4, the voltages on the unselected SSL, the selected WL and the unselected GSL are boosted to a level like VPASSR. The other voltages are maintained. At time t5, the voltages on the selected SSL, unselected SSL, WL N, selected WL, WL M, selected GSL, and unselected GSL signal lines are dropped to equal recovery voltage levels in this example. The CSL voltage is maintained at the CSL bias voltage, and the BL voltage is dropped to the CSL bias voltage. After time t6, all voltages are dropped to VSS.

FIG. 8 is a timing diagram for an example of a read setup operation, in which cell current flows. The timing can be considered in three intervals. The first interval between times t0 and t2 corresponds with a precharge operation. The second interval between times t2 and t4 includes the read setup bias arrangement. The third interval between times t4 and t6 corresponds with a voltage recovery operation.

In this timing diagram, the bit line select signal BLS is set at a pass level bias, connecting the bit line to the sense amplifier circuitry throughout the operation. All the other signal lines are initially set to a voltage level such as VSS. Between t0 and t1, the selected SSL, unselected SSL, WL N, selected WL, WL M, selected GSL, and unselected GSL signal lines are raised to an initial state such as VDD, which can for example set up a charge pump voltage boost. The CSL line is set to a CSL bias voltage for the read, which can be VSS or a different voltage, VCSL. The bit line BL is set to the same voltage as the CSL. Between times t1 and t2, all the signal lines, with the exception that the common source line CSL and the bit line are boosted to a pass voltage level VPASSR.

During the interval t2 to t4, the read setup bias is applied. During time t2 to t3, the voltages are maintained, except on the unselected SSL and the unselected GSL, which are discharged to a recovery level, which can be about VSS. At time t3, all the voltages are maintained except the bit line, which is increased to VBL. During the read setup bias between times t3 and t4, current flows because the memory cells have threshold states below VPASSR from the CSL, through the memory cell on the bit line BL to the sense amplifier circuit.

During the interval between t4 and t6, the voltages are recovered. At time t4, the voltages on the unselected SSL and the unselected GSL are boosted to a level like VPASSR. The other voltages are maintained. At time t5, the voltages on the selected SSL, unselected SSL, WL N, selected WL, WL M, selected GSL, and unselected GSL signal lines are dropped to equal recovery voltage levels in this example. The CSL voltage is maintained at the CSL bias voltage, and the BL voltage is dropped to the CSL bias voltage. After time t6, all voltages are dropped to VSS.

FIG. 9 is a timing diagram for a first example of a no-current read setup operation, in which no cell current flows. The timing can be considered in three intervals. The first interval between times t0 and t2 corresponds with a precharge operation. The second interval between times t2 and t4 includes the no-current read setup bias arrangement. The third interval between times t4 and t6 corresponds with a voltage recovery operation.

In this timing diagram, the bit line select signal BLS is set at a pass level bias, connecting the bit line to the sense amplifier circuitry throughout the operation. All the other signal lines are initially set to a voltage level such as VSS. Between t0 and t1, the selected SSL, unselected SSL, WL N, selected WL, WL M, selected GSL, and unselected GSL signal lines are raised to an initial state such as VDD, which can for example set up a charge pump voltage boost. The CSL line is set to a CSL bias voltage for the read, which can be VSS or a different voltage, VCSL. The bit line BL is set to the same voltage as the CSL. Between times t1 and t2, all the signal lines, with the exception of the common source line CSL and the bit line are boosted to a pass voltage level VPASSR.

During the interval t2 to t4, the no-current read setup bias is applied. During time t2 to t3, the voltages are maintained, except on the selected SSL, the unselected SSL and the unselected GSL, which are discharged to a recovery level, which can be about VSS. At time t3, all the voltages are maintained except the bit line, which is increased to VBL. Because the selected SSL voltage is at VSS, the string select gate is off blocking current flow to the bit line and sense amplifier circuit. As a result, during the read setup bias between times t3 and t4, no current flows even though the memory cells have threshold states below VPASSR from the CSL, through the memory cell on the bit line BL to the sense amplifier circuit.

During the interval between t4 and t6, the voltages are recovered. At time t4, the voltage on the unselected GSL is boosted to a level like VPASSR. The other voltages are maintained. At time t5, the voltages on the WL N, selected WL, WL M, selected GSL, and unselected GSL signal lines are dropped to equal recovery voltage levels in this example. The selected SSL and unselected SSL are maintained a VSS in this example. The CSL voltage is maintained at the CSL bias voltage, and the BL voltage is dropped to the CSL bias voltage. After time t6, all voltages are dropped to VSS.

FIG. 10 is a timing diagram for a second example of a "no-current" read setup operation, in which no cell current flows. The timing can be considered in three intervals. The first interval between times t0 and t2 corresponds with a precharge operation. The second interval between times t2 and t4 includes the no-current read setup bias arrangement. The third interval between times t4 and t6 corresponds with a voltage recovery operation.

In this timing diagram, the bit line select signal BLS is set at a pass level bias, connecting the bit line to the sense amplifier circuitry throughout the operation. All the other signal lines are initially set to a voltage level such as VSS. Between t0 and t1, the selected SSL, unselected SSL, WL N, selected WL, WL M, selected GSL, and unselected GSL signal lines are raised to an initial state such as VDD, which can for example set up a charge pump voltage boost. The CSL line is set to a CSL bias voltage for the read, which can be VSS or a different voltage, VCSL. The bit line BL is set to the same voltage as the CSL. Between times t1 and t2, all the signal lines, with the exception of the common source line CSL and the bit line are boosted to a pass voltage level VPASSR.

During the interval t2 to t4, the no-current read setup bias is applied. During time t2 to t3, the voltages are maintained, except on the unselected SSL, the selected GSL, and the unselected GSL, which are discharged to a recovery level, which can be about VSS. At time t3, all the voltages are maintained except the bit line, which is increased to VBL. Because the selected GSL voltage is at VSS, the source side select gate is off blocking current flow to the bit line and sense amplifier circuit. As a result, during the read setup bias between times t3 and t4, no current flows even though the memory cells have threshold states below VPASSR from the CSL, through the memory cell on the bit line BL to the sense amplifier circuit.

During the interval between t4 and t6, the voltages are recovered. At time t4, the voltage on the unselected SSL is boosted to a level like VPASSR. The other voltages are maintained. At time t5, the voltages on the WL N, selected WL, WL M, selected GSL, and unselected SSL signal lines are dropped to equal recovery voltage levels in this example. The selected GSL and unselected GSL are maintained at VSS in this example. The CSL voltage is maintained at the CSL bias voltage, and the BL voltage is dropped to the CSL bias voltage. After time t6, all voltages are dropped to VSS.

FIG. 11 is a timing diagram for a second example of a "no-current" read setup operation, in which no cell current flows. The timing can be considered in three intervals. The first interval between times t0 and t2 corresponds with a precharge operation. The second interval between times t2 and t4 includes the no-current read setup bias arrangement. The third interval between times t4 and t6 corresponds with a voltage recovery operation.

In this timing diagram, the bit line select signal BLS is set at VSS, or a bias that turns off the bit line select gate, which blocks current flow between the bit line and the sense amplifier circuitry throughout the operation. Otherwise, the bias arrangement is like that described with respect to FIG. 8, and not described again. In other embodiments, the bias arrangement can be like the read operation of FIG. 7 or read setup operations like those described with respect to FIG. 9 and FIG. 10.

In all the read setup bias arrangements described with reference to FIGS. 9 to 11, the control circuits disable current flow through the selected memory cells, selected NAND strings and selected sub-blocks to the sense amplifier circuits during the read setup bias.

The illustrated bias arrangements are applied to the circuit structures of FIGS. 2, 3A and 3B. Generally, any switch, such as any MOSFET node, in the current path from the source side bias (e.g. CSL) to the drain side bias in the sense amplifier circuit can be opened to disable current flow during the operation. In some embodiments, for example, it might be possible to disable current flow utilizing dummy word lines, which control dummy memory cells in the NAND strings. There may be a special purpose switch added to the current path in some embodiments.

In some embodiments, at least two switches in the current path are opened to disable current flow. So, current can be blocked by at least two switches selected from a group including 1) controlling the string select gate to disconnect the NAND string from the corresponding bit line, 2) controlling the source side select gate to disconnect the NAND string from the source side reference line, and 3) controlling the bit line select gates to disconnect the bit lines coupled to the selected memory cells from the sense amplifier circuits.

Also, the channels of the NAND strings are stressed by the electric field established by the word line voltages to prevent electron migration, or reverse electron migration away from the inversion regions of the memory cells, and the resistivities of the memory cells are maintained at more consistent levels during the operating lives of the NAND blocks in the array.

Figure 12:
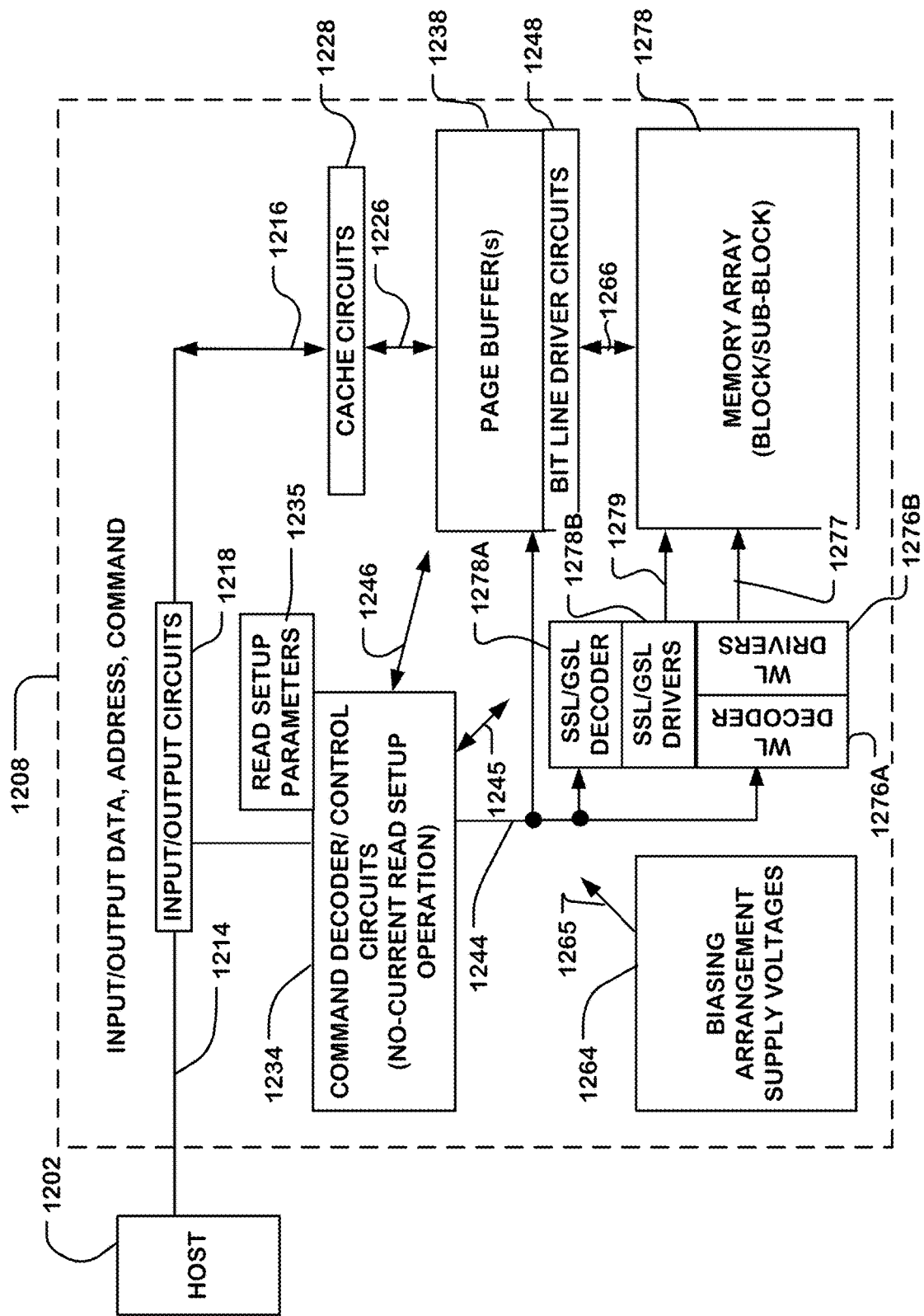
FIG. 12 is a block diagram of a memory system as described herein.

FIG. 12 is a simplified diagram of a memory system including a flash memory device 1208 implemented on an integrated circuit and a host 1202 including logic for issuing commands such as read commands, and program commands with addresses and data to be programmed. In some embodiments, the host can issue read setup commands to initiate read setup operations on the memory device 1208. The memory device 1208 can be implemented on a single integrated circuit chip, on a multichip module, or on a plurality of chips configured as suits a particular need.

The memory device 1208 in this example includes a memory array 1278 including a plurality of blocks as described above, each having a plurality of sub-blocks, on an integrated circuit substrate. The memory array 1278 can be a NAND flash memory implemented using two-dimensional or three-dimensional array technology.

In various embodiments, the memory device 1208 may have single-level cells (SLC), or multiple-level cells storing more than one bit per cell (e.g., MLC, TLC or XLC).

The memory device 1208 includes a memory array 1278, which can be a NAND flash memory implemented using three-dimensional array technology having one or multiple planes, each plane having multiple blocks, and each block having multiple sub-blocks.

A word line decoder 1276A is coupled via word line driver circuits 1276B to a plurality of word lines 1277 in the memory array 1278. SSL/GSL decoder 1278A is coupled via SSL/GSL driver circuits 1278B by SSL and GSL lines 1279, to bit line side (SSL) and common source side (GSL) string select gates in the array. Page buffer circuits 1238 are coupled by bit line driver circuits 1248 to bit lines 1266 in the memory array 1278. Column decoder circuits, including bit line select (BLS) gates can be included for routing data from the bit line drivers to selected bit lines. The page buffer circuits 1238 can store pages of data that define a data pattern for a page program operation, and can include sensing circuits used in read and verify operations.

Bit lines for memory arrays can comprise global bit lines (GBL) and local bit lines. Bit lines generally comprise metal conductors in higher patterned layers that traverse a plurality of blocks of memory cells in an array. The global bit lines are connected to the NAND strings for current flow to and from the bit lines, which in turn are connected to the bit line driver circuits 1248 and page buffer circuits 1238. Likewise, the word lines can include global word lines and local word lines with corresponding supporting circuits 1276B in the word line drivers.

In a sensing operation, sensed data from the page buffer circuits 1238 are supplied via second data lines in bus system 1226 to cache circuits 1228, which are in turn coupled to input/output circuits 1218 via data path links 1216. Also, input data is applied in this example to the cache circuits 1228 on links 1216, and to the page buffer circuits 1238 on bus system 1226, for use in support of program operations.

Input/output circuits 1218 are connected by link 1214 (including I/O pads) and provide communication paths for the data, addresses and commands with destinations external to the memory device 1208, including the host 1202 in this example. The input/output circuits 1218 provide a communication path by link 1216 to cache circuits 1228 which support memory operations. The cache circuits 1228 are in data flow communication (using for example a bus system 1226) with page buffer circuits 1238.

Control circuits 1234 are connected to the input/output circuits 1218, and include command decoder logic, address counters, state machines, timing circuits and other logic circuits that control various memory operations, including program, read, and erase operations for the memory array 1278. Control circuit signals are distributed to circuits in the memory device, as shown by arrows 1245, 1246, as required to support the operations of the circuits. The control circuits 1234 can include address registers and the like for delivery of addresses as necessary to the components of the memory device 1208, including delivery to the cache circuits 1228 and, on link 1244, to the page buffer circuits 1238, word line decoder 1276A and SSL/GSL decoder 1278A in this illustration.

In the example shown in FIG. 12, control circuits 1234 include control logic circuits that include modules implementing a bias arrangement state machine, or machines, which controls, or control, the application of bias voltages generated or provided through the voltage supply or supplies in block 1264, including read setup, read, erase, verify and program voltages including precharge voltages, pass voltages and other bias voltages as described herein to word line driver circuits 1276B and bit line driver circuits 1248, for a set of selectable program, read setup and read operations. Bias voltages are applied as represented by arrow 1265, to components of the memory device 1208, as necessary for support of the operations.

The control circuits 1234 can include modules implemented using special-purpose logic circuitry including state machines, as known in the art. In alternative embodiments, the control circuits 1234 can include modules implemented using a general-purpose processor, which can be implemented on the same integrated circuit, which execute a computer program to control the operations of the memory device 1208. In yet other embodiments, a combination of special-purpose logic circuitry and a general-purpose processor can be utilized for implementation of modules in control circuits 1234.

The flash memory array 1278 can comprise floating gate memory cells or dielectric charge trapping memory cells configured to store multiple bits per cell, by the establishment of multiple program levels that correspond to amounts of charge stored, which in turn establish memory cell threshold voltages Vt. The technology can be used with single-bit-per-cell flash memory, and with other multiple-bit-per-cell and single-bit-per-cell memory technologies. In other examples, the memory cells may comprise programmable resistance memory cells, phase change memory cells, and other types of non-volatile and volatile memory cell technologies.

In the illustrated example, the host 1202 is coupled to links 1214 on the memory device 1208, as well as other control terminals not shown, such as chip select terminals and so on, and can provide commands or instructions to the memory device 1208. In some examples, the host 1202 can be coupled to the memory device using a serial bus technology, using shared address and data lines. The host 1202 can comprise a general purpose processor, a special purpose processor, a processor configured as a memory controller, or other processor that uses the memory device 1208. All or part of the host 1202 can be implemented on the same integrated circuit as the memory.

The host 1202 can include a file system or file systems that store, retrieve, and update data stored in the memory based on requests from an application program. In general, the host 1202 can include programs that perform memory management functions including, in some embodiments, functions to control or support read setup operations as described here. Other memory management functions can include, for example, wear leveling, bad block recovery, power loss recovery, garbage collection, error correction, and so on. Also, the host 1202 can include application programs, file systems, flash translation layer programs and other components that can produce status information for data stored in the memory, including issuing commands to program data having addresses and data to be programmed.

In the example illustrated in FIG. 12, the memory device includes a set of status registers 1235 to store parameters for read and for read setup operations. The parameters can define the voltage levels to be applied, whether to turn on or off the string select and ground select gates, pulse durations and so on, as discussed with reference to FIGS. 7 to 11. Also, the parameters can include a starting plane and block address and a range of block addresses (or addresses of other read setup units) to be subject of a particular read setup operation. The parameters can include indicators for planes, and blocks within planes, and sub-blocks within blocks to be activated simultaneously for read setup operations. Some or all of the parameters can be provided by read setup commands, and some or all can be stored as configuration data on the chip.

A state machine on the memory device can access the read setup parameters, and execute a no-current read setup operation including address generation and applying bias voltages to traverse the memory array to maintain read ready status across the memory. The operation can include a starting block and an ending block. The operation can include a pattern of blocks in one plane or in multiple planes that can be subjected to the read setup operation simultaneously. The operation can be configured to traverse the array or parts of the array as a background operation, without external control. The operation can be configured to operate in response to read setup commands, carrying the read setup parameters and identifying segments of the array to be operated on by the read setup operation. The read setup commands can be generated by a memory controller in the host, for example, which monitors block status, such as by identifying cold blocks in a wear leveling operation as stale blocks, and can send commands identifying stale blocks, or can send commands during time intervals in which the memory array is idle or expected to be idle. The state machine can set a ready/busy pin on the memory device to signal the control program on the memory controller for coordination of the read setup operations.

Figure 13:
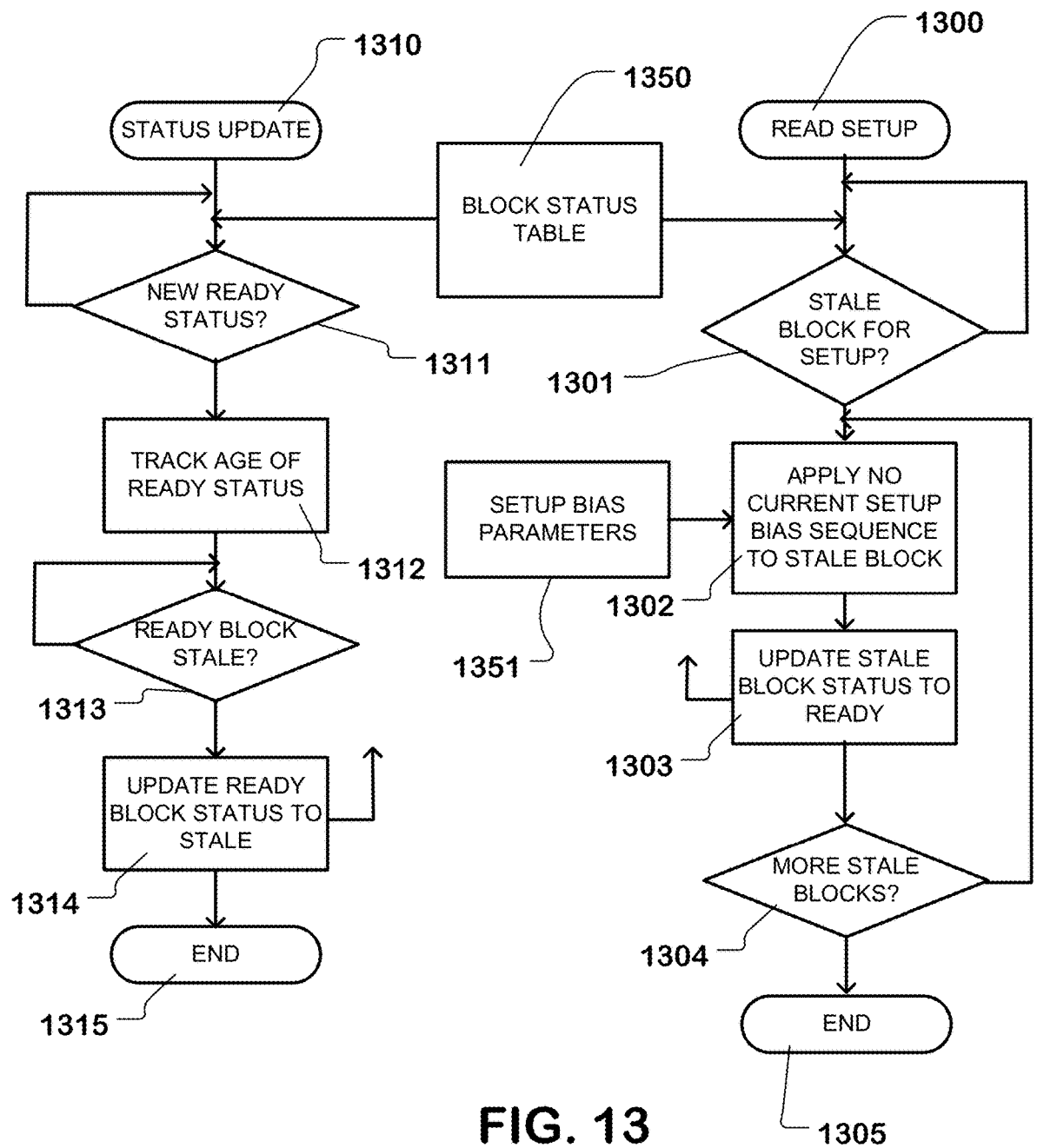
FIG. 13 is a flow chart of read setup operations as described herein.

FIG. 13 is a flowchart for a representative method of operating a NAND memory including a plurality of blocks of memory cells arranged in NAND strings, each block including a distinct set of NAND strings. As described above, each block can include a plurality of sub-blocks, each sub-block including a distinct subset of NAND strings.

In FIG. 13, a read setup operation begins as indicated at 1300. The operation first identifies a stale block as the subject of the read setup operation (1301). The operation can identify stale blocks by accessing a block status table 1350, which indicates a status of the blocks in the memory as stale, meaning that they are flagged for a read setup operation, or ready meaning that they can be read without requiring a read setup operation. Also, the operation can identify stale blocks as parameters carried in a read setup command received from an external controller. If there are no stale blocks available for read setup, the algorithm loops to wait for an indication of the stale block, or the algorithm can terminate and restart after a predetermined interval. Next, for an identified stale block, a no-current read setup bias sequence is applied (1302). The no-current read setup bias sequence can be configured in response to read setup bias parameters stored in status registers 1351. After applying a no-current read setup bias sequence to a stale block, the block status table 1350 is updated to indicate that the block is ready (1303). Next, the operation determines whether there are more stale blocks (1304). If not, the algorithm ends at 1305. If there are more stale blocks at 1304, the algorithm loops back to block 1302 to continue applying read setup bias sequences to the stale blocks.

A controller managing the read setup operation can also execute a status update operation 1310. The status update operation can monitor the block status table 1350 to identify blocks that have been newly set as ready (1311). If a newly set ready block is identified, then the operation begins tracking the age of the ready status for the block (1312). If the ready block becomes stale (1313), such as by having set a ready status, such as by having been read or having been subject of a read setup operation, having an age longer than a specific duration (e.g. 10 minutes), then the controller can update the ready block status to stale in the block status table 1350 (1314). After updating the status, then the operation is finished as to the new ready status block. This cycle of steps 1310 to 1315 can be executed in parallel for all the blocks in the block status table. In alternative systems, all the blocks in the system are traversed and updated from the ready to stale status periodically so that the read setup operation is applied systematically across the array, without requiring monitoring of the read status of each block separately. In some embodiments, a block status table indicating stale blocks is not required, but rather status in maintained on-chip or in a host, indicating an order in the systematic traversal of the array independent of read commands.

FIG. 13 is one example of an operating method that includes traversing the plurality of blocks to apply read setup bias arrangements to stale blocks in the plurality of blocks which condition the stale blocks for read operations, where the read setup bias arrangements include simultaneously applying a read setup bias to a plurality of memory cells of a selected block of the plurality of blocks.

Also, FIG. 13 is one example of an operating method that can operate independently of read commands, such as in the background.

Figure 14:
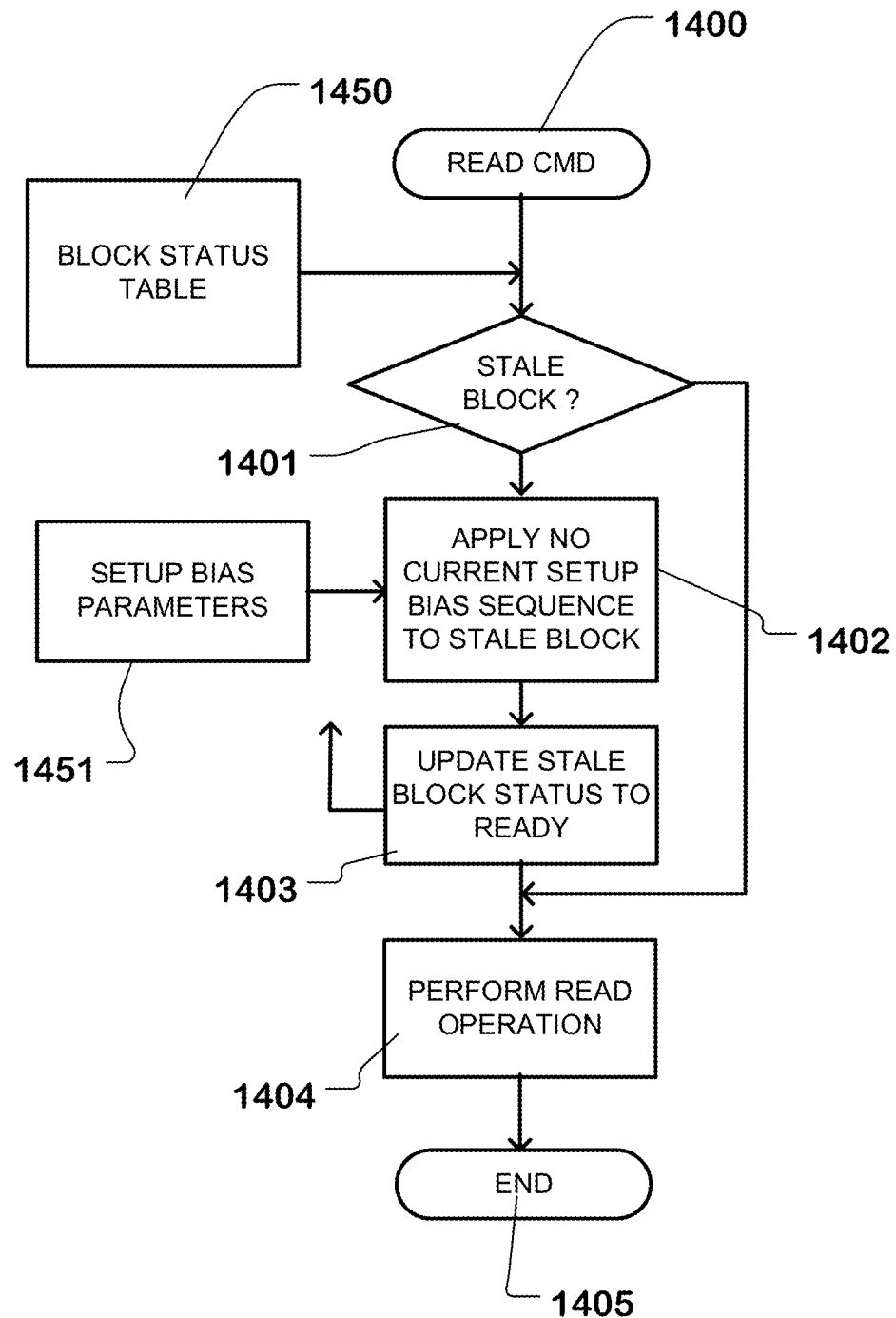
FIG. 14 is a flow chart of a read operation with read setup operations for stale blocks.

FIG. 14 illustrates a read operation for a system like that described herein. In the method of FIG. 14, a read command is received to initiate the read operation at 1400. The algorithm determines whether the read is directed to a stale block by, for example, accessing a block status table 1450 (1401). If not, then the read operation can proceed to perform the read subject of the command (1404). If the block is a stale block at 1401, then the read operation causes execution of a no-current read setup bias sequence to the stale block (1402), applying bias voltages having parameters set by the setup bias parameters 1451. After applying the no-current read setup bias sequence, the status of the block is updated in the block status table 1450 (1403). Also, the read subject of the command is performed (1404). After performing the read subject of the command, the operation is terminated (1405).

FIGS. 13 and 14 are examples of operations that can be utilized to perform no-current read setup procedures as described herein, that apply bias arrangements in parallel, or simultaneously to a plurality of memory cells, such as to multiple memory cells coupled to a single bit line, to all the memory cells in a sub-block, to all the memory cells in a block, to all the memory cells in multiple sub-blocks, or to all the memory cells in multiple blocks.

FIGS. 13 and 14 are flowcharts illustrating logic executed by a memory controller or by a memory device. The logic can be implemented using processors programmed using computer programs stored in memory accessible to the computer systems and executable by the processors, by dedicated logic hardware, including field programmable integrated circuits, and by combinations of dedicated logic hardware and computer programs. With all flowcharts herein, it will be appreciated that many of the steps can be combined, performed in parallel or performed in a different sequence without affecting the functions achieved. In some cases, as the reader will appreciate, a rearrangement of steps will achieve the same results only if certain other changes are made as well. In other cases, as the reader will appreciate, a rearrangement of steps will achieve the same results only if certain conditions are satisfied. Furthermore, it will be appreciated that the flow charts herein show only steps that are pertinent to an understanding of the invention, and it will be understood that numerous additional steps for accomplishing other functions can be performed before, after and between those shown.

A technology is described herein that can execute read setup operations at high speed, and more often than available in prior technologies, thereby improving the memory cell operation window by maintaining the memory cells in condition for having thresholds as set during the program operation. These technologies are particularly beneficial in large high density memory systems. For example, if there are multiple sub-blocks in one block, all the sub-blocks of one block can be subject of the read setup operation simultaneously to improve the speed of the operation. Also, if there are multiple blocks in one memory plane, multiple blocks can be subject of the read setup operation simultaneously to improve the speed of the operation. Also, if there are multiple planes in one memory device, the read setup operation can be applied simultaneously to blocks or sub-blocks in the multiple planes to improve the speed of the operation.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A device, comprising:
    a plurality of memory cells and a plurality of bit lines, memory cells in the plurality of memory cells accessible by corresponding bit lines in the plurality of bit lines;
    sense amplifier circuits;
    control circuits comprising logic to execute a read setup operation, the read setup operation comprising applying a read setup bias to selected memory cells in the plurality of memory cells, and disabling current flow through the selected memory cells to the sense amplifier circuits during the read setup bias; and
    a switch in a current path between a source side reference voltage and the sense amplifier circuits, wherein the control circuits disable the current flow during the read setup bias by opening the switch.

2. The device of claim 1, wherein the plurality of memory cells is configured as a plurality of NAND strings, each NAND string in the plurality of NAND strings having a string select gate controllable to connect the NAND string to, or disconnect the NAND string from, a corresponding bit line in the plurality of bit lines, and wherein the read setup operation disables said current flow by controlling the string select gate to disconnect the NAND string from the corresponding bit line.

3. The device of claim 1, wherein the plurality of memory cells is configured as a plurality of NAND strings, each NAND string in the plurality of NAND strings having a source side select gate controllable to connect the NAND string to, or disconnect the NAND string from, a source side reference line, and wherein the read setup operation disables said current flow by controlling the source side select gate to disconnect the NAND string from the source side reference line.

4. The device of claim 1, including bit line select gates controllable to connect and disconnect bit lines from the sense amplifier circuits, and wherein the read setup operation disables said current flow by controlling the bit line select gates to disconnect the bit lines coupled to the selected memory cells from the sense amplifier circuits.

5. The device of claim 1, wherein the plurality of memory cells is configured as a plurality of NAND strings, each NAND string in the plurality of NAND strings having a string select gate controllable to connect the NAND string to, or disconnect the NAND string from, a corresponding bit line in the plurality of bit lines, and a source side select gate controllable to connect the NAND string to, or disconnect the NAND string from a source side reference line, and wherein the read setup operation disables said current flow by at least two of a group including 1) controlling the string select gate to disconnect the NAND string from the corresponding bit line, 2) controlling the source side select gate to disconnect the NAND string from the source side reference line, and 3) controlling the bit line select gates to disconnect the bit lines coupled to the selected memory cells from the sense amplifier circuits.

6. The device of claim 1, wherein the plurality of memory cells is configured as a plurality of blocks, and the control circuits include logic to traverse the blocks in the plurality of blocks to apply the read setup operation simultaneously to plural memory cells in the blocks in the plurality of blocks.

7. The device of claim 6, wherein the blocks in the plurality of blocks include, respectively, a plurality of sub-blocks, wherein sub-blocks in the plurality of sub-blocks are arranged to be activated for memory operations in response to corresponding sub-block string select lines, and a sub-block comprises a plurality of NAND strings, and the read setup operation includes traversing the sub-blocks in the selected block, to simultaneously apply the read setup bias to respective pluralities of memory cells of individual sub-blocks of the selected block.

8. The device of claim 1, wherein the plurality of memory cells includes charge trapping memory cells having thin film channels, and the read setup bias conditions the thin film channels for a subsequent read operation.

9. The device of claim 1, wherein the plurality of memory cells is configured as a 3D array of charge trapping memory cells.

10. A method of operating a memory including a plurality of memory cells, sense amplifier circuits and a switch in a current path between a source side reference voltage and the sense amplifier circuits, the method comprising:
    traversing the plurality of memory cells to apply read setup bias arrangements to selected memory cells in the plurality of memory cells, the read setup bias arrangements including simultaneously applying a read setup bias to the selected memory cells, and disabling current flow during the read setup bias,
    wherein the current flow is disabled during the read setup bias by opening the switch.

11. The method of claim 10, wherein the plurality of memory cells is configured as a plurality of NAND strings and a plurality of bit lines, each NAND string in the plurality of NAND strings having a string select gate controllable to connect the NAND string to, or disconnect the NAND string from, a corresponding bit line in the plurality of bit lines, and including disabling the current flow by controlling the string select gate to disconnect the NAND string from the corresponding bit line.

12. The method of claim 10, wherein the plurality of memory cells is configured as a plurality of NAND strings, each NAND string in the plurality of NAND strings having a source side select gate controllable to connect the NAND string to, or disconnect the NAND string from, a source side reference line, and including disabling the current flow by controlling the source side select gate to disconnect the NAND string from the source side reference line.

13. The method of claim 10, wherein the memory includes bit line select gates to connect or disconnect bit lines from sense amplifier circuitry, and including disabling the current flow by controlling the bit line select gates to disconnect the bit lines coupled to the selected memory cells from the sense amplifier circuits.

14. The method of claim 10, wherein the plurality of memory cells is configured as a plurality of NAND strings, a plurality of bit lines, a plurality of sense amplifier circuits and bit line select gates to connect to, or disconnect bit lines from, corresponding sense amplifier circuits in the plurality of sense amplifier circuits, each NAND string in the plurality of NAND strings having a string select gate controllable to connect the NAND string to, or disconnect the NAND string from, a corresponding bit line in the plurality of bit lines, and a source side select gate controllable to connect the NAND string to, or disconnect the NAND string from, a source side reference line, and including disabling the current flow by at least two of a group including 1) controlling the string select gate to disconnect the NAND string from the corresponding bit line, 2) controlling the source side select gate to disconnect the NAND string from the source side reference line, and 3) controlling the bit line select gates to disconnect the bit lines coupled to the selected memory cells from the corresponding sense amplifier circuits.

15. A method of operating a memory having a plurality of blocks of memory cells and a plurality of bit lines, and a plurality of sense amplifier circuits, the method comprising:
traversing the plurality of blocks to apply read setup bias arrangements to identified stale blocks in the plurality of blocks which condition the stale blocks for read operations, wherein the stale blocks are identified as being blocks in the plurality of blocks that are flagged for a read operation, the read setup bias arrangements including simultaneously applying a read setup bias to a plurality of memory cells of an identified stale block of the plurality of blocks, and disabling current flow through the plurality of memory cells to sense amplifier circuits in the plurality of sense amplifier circuits during the read setup bias.

16. The method of claim 15, including maintaining a block status table identifying stale blocks.

17. The method of claim 15, wherein each block in the plurality of blocks of memory cells includes a plurality of sub-blocks, each sub-block including a distinct subset of the memory cells of the block, the distinct subset in each sub-block being operatively connected to a respective select gates, and wherein the read setup bias operations are applied to more than one sub-block simultaneously.

18. The method of claim 15, wherein the memory includes switches in current paths between a source side reference voltage though the plurality of memory cells and the sense amplifier circuits, and including disabling the current flow by opening the switch.

\* \* \* \* \*